(12) United States Patent
Takahashi et al.

(10) Patent No.: US 8,981,623 B2
(45) Date of Patent: Mar. 17, 2015

(54) PIEZOELECTRIC VIBRATING PIECE, PIEZOELECTRIC DEVICE, AND METHOD FOR MANUFACTURING PIEZOELECTRIC DEVICE

(75) Inventors: Takehiro Takahashi, Saitama (JP); Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 364 days.

(21) Appl. No.: 13/552,652

(22) Filed: Jul. 19, 2012

(65) Prior Publication Data

US 2013/0020912 A1 Jan. 24, 2013

(30) Foreign Application Priority Data

Jul. 21, 2011 (JP) ................................. 2011-159494

(51) Int. Cl.
| | | |
|---|---|---|
| *H01L 41/047* | (2006.01) | |
| *H03H 9/13* | (2006.01) | |
| *H03H 3/04* | (2006.01) | |
| *H03H 9/02* | (2006.01) | |
| *H03H 9/10* | (2006.01) | |
| *H03H 9/17* | (2006.01) | |

(52) U.S. Cl.
CPC ................ *H03H 9/132* (2013.01); *H03H 3/04* (2013.01); *H03H 9/02157* (2013.01); *H03H 9/1035* (2013.01); *H03H 9/177* (2013.01); *H03H 2003/0428* (2013.01); *H03H 2003/0478* (2013.01); *H03H 2003/0485* (2013.01)
USPC ............ 310/344; 310/314; 310/365; 310/366

(58) Field of Classification Search
CPC .. H01L 41/047; H01L 41/083; H03H 9/1021; H03H 9/1014
USPC .................................... 310/314, 344, 365, 366
See application file for complete search history.

(56) References Cited

U.S. PATENT DOCUMENTS

2005/0285483 A1 12/2005 Satoh et al.
2010/0117489 A1* 5/2010 Takahashi ..................... 310/344

(Continued)

FOREIGN PATENT DOCUMENTS

| | | |
|---|---|---|
| CN | 101399527 | 4/2009 |
| JP | 05-226963 | 9/1993 |
| JP | 2011-029715 | 2/2011 |
| JP | 2011-066566 | 3/2011 |

OTHER PUBLICATIONS

"Office Action of China Counterpart Application", issued on Aug. 25, 2014, pp. 1-9.

*Primary Examiner* — Derek Rosenau
*Assistant Examiner* — Bryan Gordon
(74) *Attorney, Agent, or Firm* — Jianq Chyun IP Office

(57) ABSTRACT

A piezoelectric vibrating piece is to be bonded to and sandwiched between a lid plate and a base plate with an external electrode. The piezoelectric vibrating piece has a first main surface at the lid plate side and a second main surface at the base plate side. The piezoelectric vibrating piece includes an excitation unit, a first excitation electrode, a second excitation electrode, a framing portion, one connecting portion, a first extraction electrode, and a second extraction electrode. The connecting portion includes a planar surface parallel to both the main surfaces and a side face intersecting with the planar surface. The first extraction electrode is extracted via the connecting portion. The second extraction electrode is extracted via the connecting portion. The first extraction electrode is disposed on at least a part of the side face of the connecting portion to be extracted to the framing portion.

12 Claims, 14 Drawing Sheets

(56) References Cited

U.S. PATENT DOCUMENTS

| | | | |
|---|---|---|---|
| 2010/0201221 A1* | 8/2010 | Inoue et al. | 310/312 |
| 2012/0032561 A1* | 2/2012 | Mizusawa et al. | 310/344 |
| 2012/0043860 A1* | 2/2012 | Ichikawa et al. | 310/344 |
| 2012/0068578 A1* | 3/2012 | Takahashi | 310/344 |
| 2012/0098390 A1* | 4/2012 | Takahashi | 310/348 |

\* cited by examiner

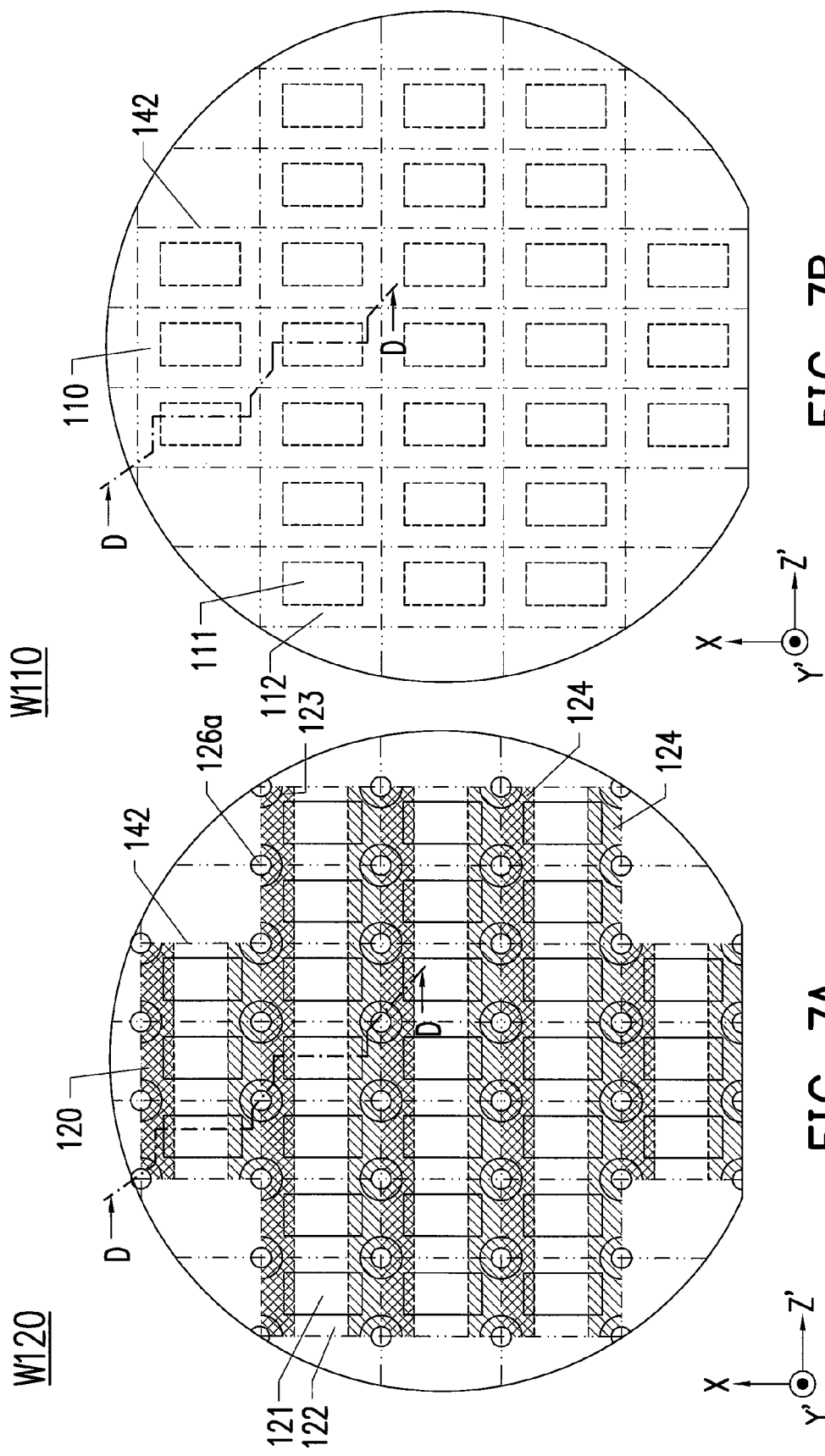

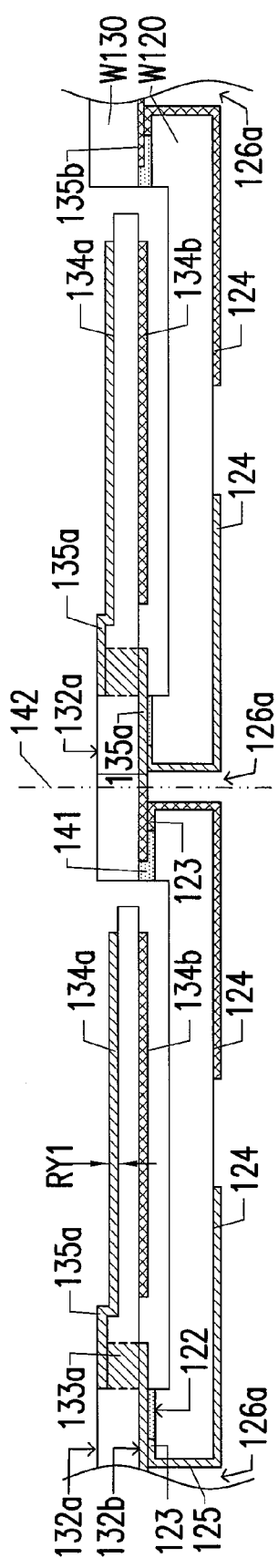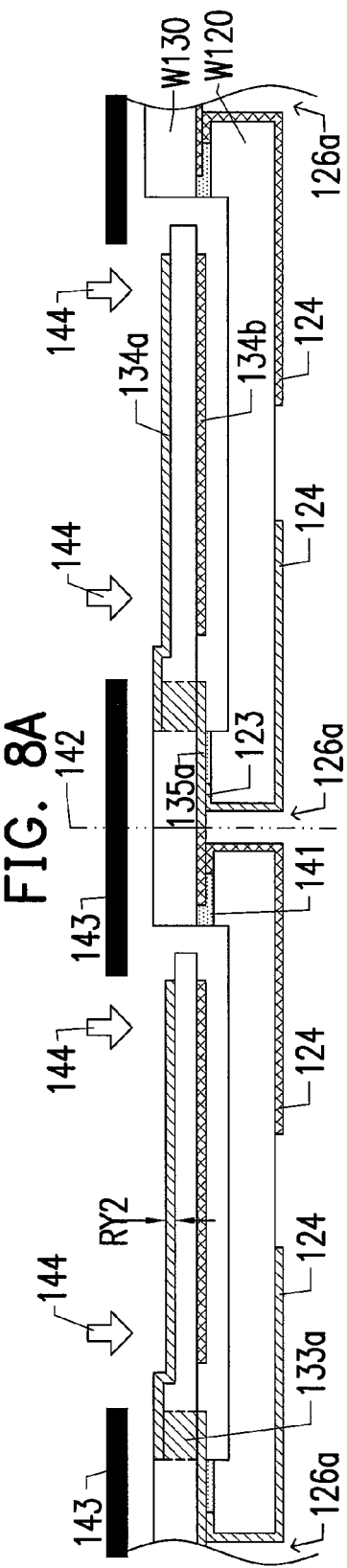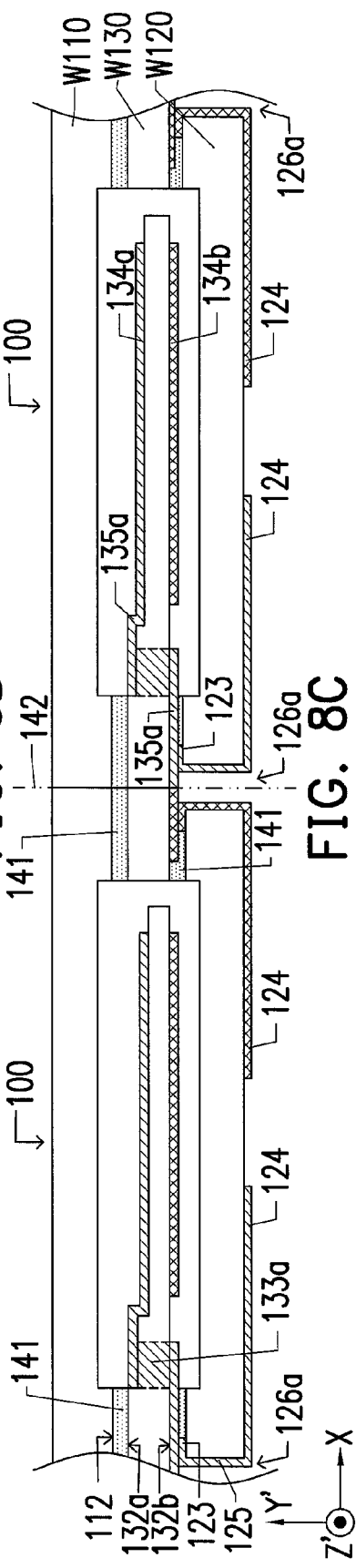

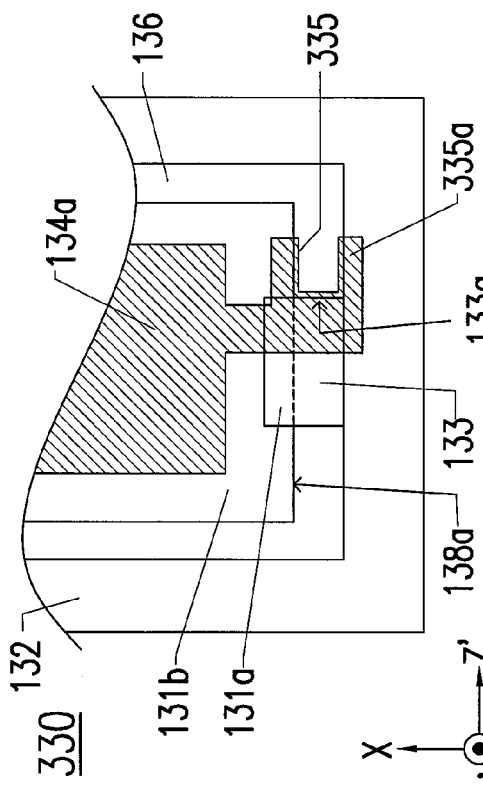
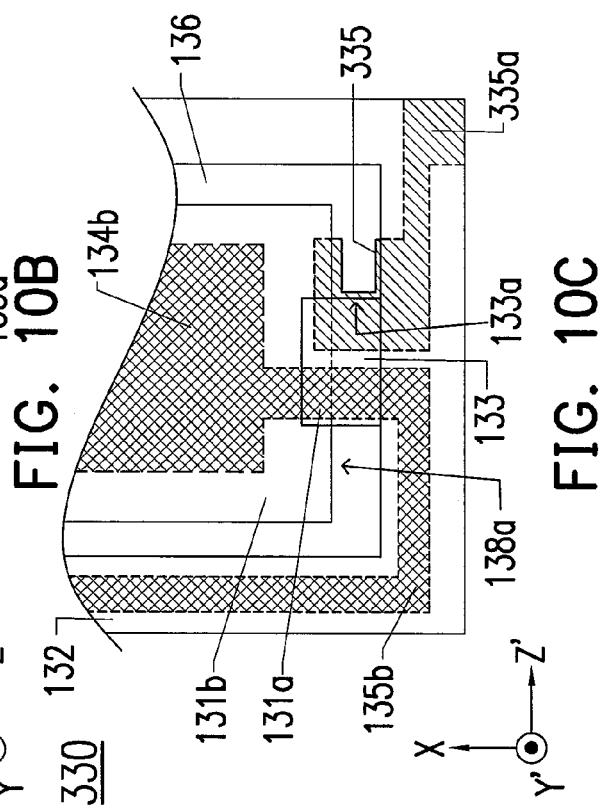
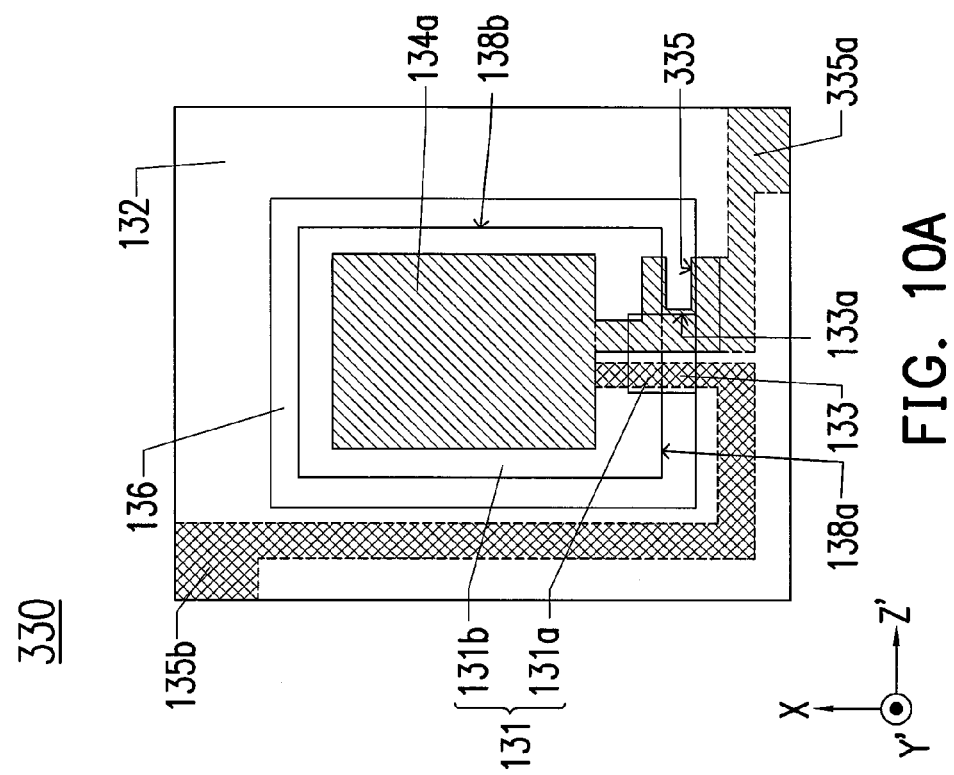
FIG. 10A
FIG. 10B
FIG. 10C

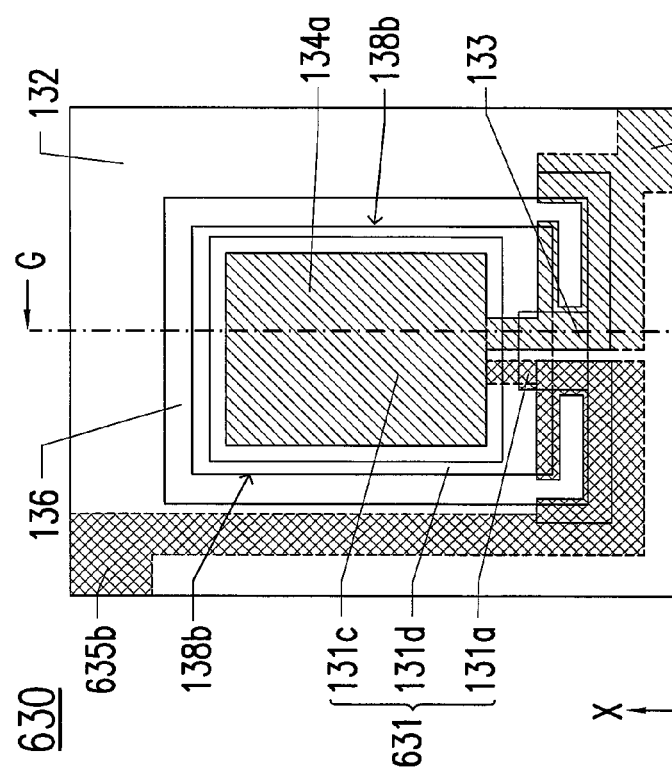
FIG. 13A
FIG. 13B
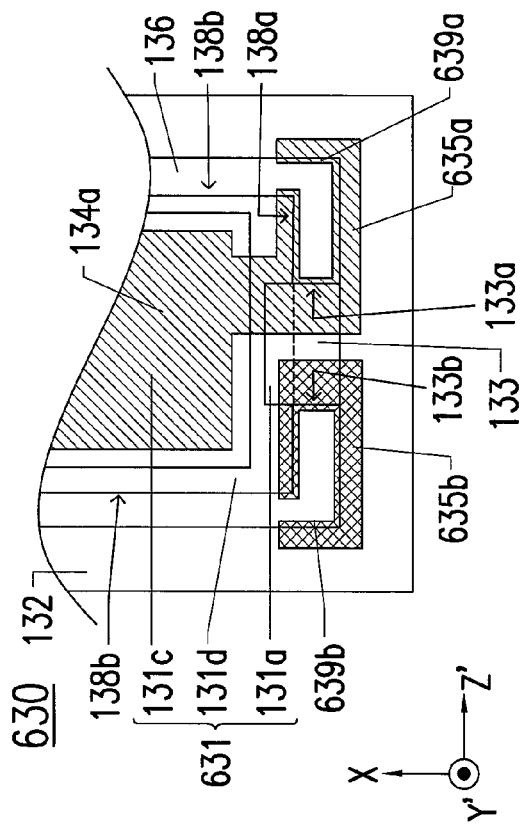
FIG. 13C
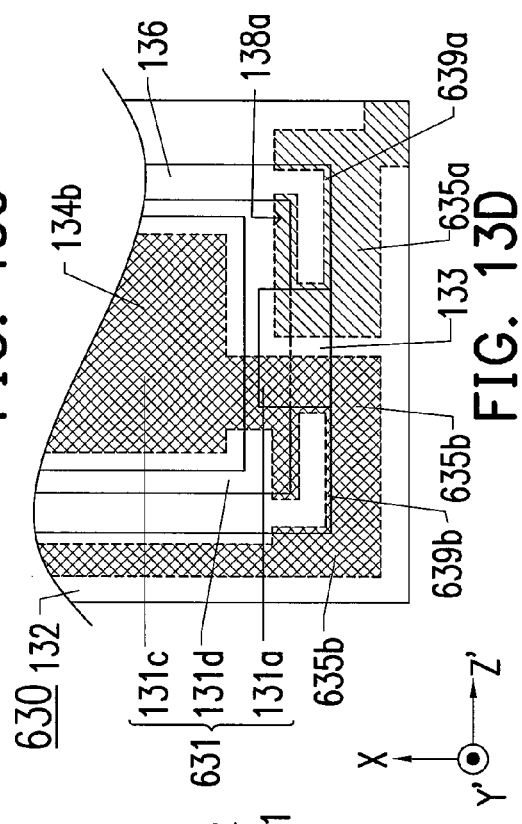
FIG. 13D

PIEZOELECTRIC VIBRATING PIECE, PIEZOELECTRIC DEVICE, AND METHOD FOR MANUFACTURING PIEZOELECTRIC DEVICE

CROSS-REFERENCE TO RELATED APPLICATIONS

This application claims the priority benefit of Japan application serial no. 2011-159494, filed on Jul. 21, 2011. The entirety of the above-mentioned patent application is hereby incorporated by reference herein and made a part of this specification.

FIELD

This disclosure relates to piezoelectric vibrating pieces and piezoelectric devices that include extraction electrodes with large areas on connecting portions, and methods for manufacturing such piezoelectric devices.

DESCRIPTION OF THE RELATED ART

A known piezoelectric vibrating piece includes an excitation unit that vibrates at a predetermined vibration frequency. The piezoelectric vibrating piece is secured and supported by, for example, a supporting member inside a package, thus forming a piezoelectric device. The piezoelectric device is used to be mounted on, for example, a printed circuit board. The piezoelectric vibrating piece has a problem in that a vibration characteristic is changed by stress such as strain generated when the piezoelectric vibrating piece is packaged.

To solve this problem, for example, Japanese Unexamined Patent Application Publication No. 5-226963 proposes a piezoelectric resonator piece that includes a slit. The slit is formed by hollowing out an outer periphery of a vibrator that generates main vibration. That is, the piezoelectric resonator piece disclosed in this publication includes the vibrator, an end portion, and one connecting portion, which connects the vibrator and the end portion. The end portion surrounds the vibrator. The end portion is secured to and supported by a package with, for example, a supporting member. In this piezoelectric resonator piece disclosed in the publication, a portion supported by the supporting member and the vibrator are mechanically separated. This prevents transmission of strain or the like, which is generated when the piezoelectric vibrating piece is packaged, to the vibrator.

In addition to the strain or the like, which is generated when the piezoelectric vibrating piece is packaged, bending stress applied to a printed circuit board is transmitted to the piezoelectric vibrating piece. Thus, the piezoelectric vibrating piece possibly undergoes the stresses at all times while the piezoelectric device is mounted on a printed circuit board. Forming one connecting portion with a narrow width reduces transmission of these stresses to the vibrator. In this case, a problem arises in that this thin connecting portion provides a small area, for forming extraction electrodes at the connecting portion, thus increasing electrical resistance of the extraction electrode. This in turn increases a crystal impedance (CI) value of the piezoelectric vibrating piece.

Therefore, there is a need for a piezoelectric vibrating piece and a piezoelectric device, as disclosed herein, that includes extraction electrodes with large areas on a connecting portion. There is also a need for a method for manufacturing the piezoelectric device.

SUMMARY

A first aspect of a piezoelectric vibrating piece is to be bonded to and sandwiched between a lid plate and a base plate with an external electrode. The piezoelectric vibrating piece has a first main surface at the lid plate side and a second main surface at the base plate side. The piezoelectric vibrating piece includes an excitation unit in a rectangular shape, a first excitation electrode, a second excitation electrode, a framing portion, one connecting portion, a first extraction electrode, and a second extraction electrode. The excitation unit includes a first side and a second side. The first side extends in a first direction. The second side extends in a second direction perpendicular to the first direction. The first excitation electrode is on the first main surface of the excitation unit. The second excitation electrode is on the second main surface of the excitation unit. The framing portion includes a first bonding surface and a second bonding surface. The first bonding surface is a surface to be bonded to the lid plate. The second bonding surface is a surface to be bonded to the base plate. The framing portion surrounds the excitation unit. The one connecting portion connects the first side of the excitation unit and the framing portion together. The one connecting portion includes a planar surface parallel to both the main surfaces and a side face intersecting with the planar surface. The first extraction electrode is extracted from the first excitation electrode to the second bonding surface of the framing portion via the connecting portion. The second extraction electrode is extracted from the second excitation electrode to the second bonding surface of the framing portion via the connecting portion. The first extraction electrode is disposed on at least a part of the side face of the connecting portion to be extracted to the framing portion.

In the first aspect, a second aspect of a piezoelectric vibrating piece includes the first extraction electrode and the second extraction electrode that do not overlap with one another in a confronting direction of the planar surfaces or in a confronting direction of the side faces.

In the second aspect, a third aspect is directed to a piezoelectric vibrating piece where the first extraction electrode is disposed on the side face of the connecting portion, the first main surface, and the second main surface, and the second extraction electrode is disposed only on the second main surface of the connecting portion.

In the third aspect, a fourth aspect is directed to a piezoelectric vibrating piece where a width of the first extraction electrode on the second main surface of the connecting portion in the confronting direction of the side faces is smaller than a width of the second extraction electrode on the second main surface of the connecting portion in the confronting direction of the side faces.

In any one of the first aspect to the third aspect, a fifth aspect is directed to a piezoelectric vibrating piece where the first extraction electrode has a first length extracted from one end of the first excitation electrode side to another end, the other end extending to the second bonding surface, the second extraction electrode has a second length extracted from one end of the second excitation electrode side to another end, the other end extending to the second bonding surface, the first length is shorter than the second length, the first excitation electrode is thinner than the second excitation electrode, and a part of the first extraction electrode is thinner than the second extraction electrode.

In any one of the first aspect to the fifth aspect, a sixth aspect is directed to a piezoelectric vibrating piece where the first extraction electrode is disposed on the first bonding surface of the framing portion, and a total area of the first extraction electrode and the second extraction electrode at the lid plate side of the connecting portion is smaller than a total area of the first extraction electrode and the second extraction electrode at the base plate side of the connecting portion.

In any one of the first aspect to the sixth aspect, a seventh aspect is directed to a piezoelectric vibrating piece where the first extraction electrode is disposed on a side face of the first side of the excitation unit.

In the seventh aspect, an eighth aspect is directed to a piezoelectric vibrating piece where the first extraction electrode is disposed on a side face of the framing portion. The side face intersects with both the bonding surfaces.

In the fifth aspect, a ninth aspect is directed to a piezoelectric vibrating piece where a width of a portion of the first extraction electrode where the first extraction electrode connects the first excitation electrode is larger than a width of a portion of the second extraction electrode where the second excitation electrode connects the second extraction electrode.

In any one of the first aspect to the ninth aspect, a tenth aspect is directed to a piezoelectric vibrating piece where the connecting portion has a first thickness in the confronting direction of the planar surfaces. The excitation unit includes a first region and a second region. The first region includes at least a part of the first side. The first region with the first thickness is directly connected to the connecting portion in the confronting direction of the planar surfaces. The second region is other than the first region where the first and the second excitation electrodes are disposed. A thickness of the second region in the confronting direction of the planar surfaces is thinner than a thickness of the first region in the confronting direction of the planar surfaces.

In any one of the first aspect to the ninth aspect, an eleventh aspect is directed to a piezoelectric vibrating piece where the connecting portion has a first thickness in the confronting direction of the planar surfaces. The excitation unit includes a first region, a third region, and a fourth region. The first region includes at least a part of the first side. The first region with the first thickness is directly connected to the connecting portion in the confronting direction of the planar surfaces. The third region has a second thickness in the confronting direction of the planar surfaces. The first and the second excitation electrodes are disposed on the third region. The fourth region is other than the first region and the third region. The fourth region has a third thickness in the confronting direction of the planar surfaces. The fourth region is disposed between the first region and the third region. The first thickness and the second thickness are thicker than the third thickness.

A twelfth aspect is directed to a piezoelectric device that includes the piezoelectric vibrating piece according to any one of the first aspect to the eleventh aspect, the lid plate, and the base plate. The piezoelectric vibrating piece is sandwiched between the lid plate and the base plate.

A thirteenth aspect is directed to a method for manufacturing a piezoelectric device. The method includes forming outlines, forming electrodes, preparing lid wafer, preparing base wafer, bonding second main surface, adjusting vibration frequency, and bonding first main surface. The forming outlines forms outlines of a plurality of piezoelectric vibrating pieces on a piezoelectric wafer. The piezoelectric wafer has a first main surface and a second main surface. The piezoelectric wafer includes a piezoelectric material. The piezoelectric vibrating piece includes an excitation unit, a framing portion, and one connecting portion. The excitation unit is configured to vibrate at a predetermined vibration frequency. The framing portion surrounds the excitation unit. The one connecting portion connects the excitation unit and the framing portion together. The forming electrodes forms electrodes. The electrodes includes a first excitation electrode and a second excitation electrode, a first extraction electrode, and a second extraction electrode. The first excitation electrode and the second excitation electrode are respectively disposed on the first main surface and the second main surface of the excitation unit. The first extraction electrode has a first length extracted from one end of the first excitation electrode side to another end of the second bonding surface of the framing portion via the connecting portion. The first extraction electrode is disposed on at least a part of a side face of the connecting portion. The second extraction electrode has a second length extracted from one end of the second excitation electrode side to another end of the second bonding surface of the framing portion via the connecting portion. The second length is longer than the first length. The preparing lid wafer prepares a lid wafer including a plurality of lid plates. The preparing base wafer prepares a base wafer including a plurality of base plates. The bonding second main surface bonds the second main surface of the piezoelectric wafer to the base wafer via the sealing material. The adjusting vibration frequency adjusts vibration frequency of the excitation unit by reverse sputtering on the first excitation electrode. The first excitation electrode is disposed on the first main surface of the piezoelectric wafer. The bonding first main surface bonds the first main surface of the piezoelectric wafer to the lid wafer via the sealing material.

With the piezoelectric vibrating piece, the piezoelectric device, and the method for manufacturing the piezoelectric device of the present invention, the extraction electrodes with large areas are formed on the connecting portion. This prevents the CI value from increasing.

BRIEF DESCRIPTION OF THE DRAWINGS

FIG. 7A is a plan view of a base wafer W120.

FIG. 7B is a plan view of a lid wafer W110.

FIG. 8A is a partial cross-sectional view of the piezoelectric wafer W130 and the base wafer W120.

FIG. 8B is a partial cross-sectional view of the piezoelectric wafer W130 on which reverse sputtering is performed and the base wafer W120.

FIG. 8C is a partial cross-sectional view of the piezoelectric wafer W130, the lid wafer W110, and the base wafer W120.

FIG. 10A is a plan view of a piezoelectric vibrating piece 330 according to a third embodiment.

FIG. 10B is a partial plan view of the piezoelectric vibrating piece 330 illustrating electrodes on a surface at the +Y' axis side.

FIG. 10C is a partial plan view of the piezoelectric vibrating piece 330 illustrating electrodes on a surface at the −Y' axis side.

FIG. 13A is a plan view of a piezoelectric vibrating piece 630.

FIG. 13B is a cross-sectional view taken along the line G-G of FIG. 13A.

FIG. 13C is a partial plan view of the piezoelectric vibrating piece 630 illustrating electrodes on a surface at the +Y' axis side.

FIG. 13D is a partial plan view of the piezoelectric vibrating piece 630 illustrating electrodes on a surface at the −Y' axis side.

DETAILED DESCRIPTION

Each embodiment of the present invention is described below by referring to the accompanying drawings. It will be understood that the scope of the disclosure is not limited to the described embodiments, unless otherwise stated.

Configuration of a Piezoelectric Device 100 According to a First Embodiment

Figure 1:
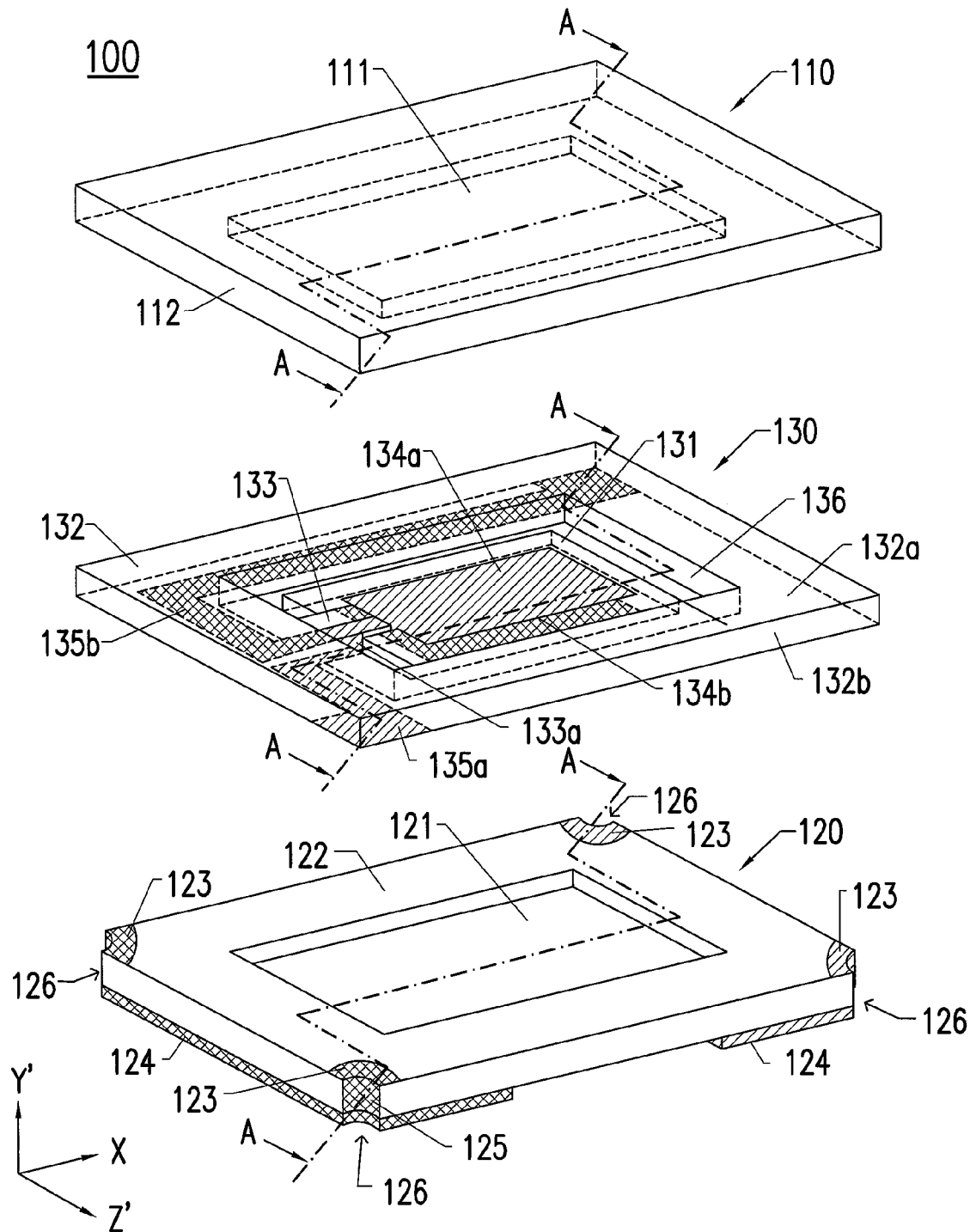
FIG. 1 is an exploded perspective view of a piezoelectric device 100 according to a first embodiment.

FIG. 1 is an exploded perspective view of the piezoelectric device 100. The piezoelectric device 100 includes a lid plate 110, a base plate 120, and a piezoelectric vibrating piece 130. The piezoelectric vibrating piece 130 employs, for example, an AT-cut quartz-crystal vibrating piece. The AT-cut quartz-crystal vibrating piece has a principal surface (in the Y-Z plane) that is tilted by 35° 15' about the Y-axis of the crystal coordinate system (XYZ) in the direction from the Z-axis to the Y-axis around the X-axis. In the following description, the new axises tilted with reference to the axis directions of the AT-cut quartz-crystal vibrating piece are denoted as the Y' axis and the Z' axis. Therefore, in description of the piezoelectric device 100, the longitudinal direction of the piezoelectric device 100 is referred as the X axis direction, the height direction of the piezoelectric device 100 is referred as the Y' axis direction, and the direction perpendicular to the X axis and Y' axis directions is referred as the Z' axis direction.

The piezoelectric vibrating piece 130 includes an excitation unit 131, which vibrates at a predetermined vibration frequency and is formed in a rectangular shape, a framing portion 132, which surrounds the excitation unit 131, and one connecting portion 133, which connects the excitation unit 131 and the framing portion 132 together. Regions other than the connecting portion 133 between the excitation unit 131 and the framing portion 132 constitutes a through-hole 136 that passes through the piezoelectric vibrating piece 130 in the Y' axis direction. The piezoelectric vibrating piece 130 is bonded to the lid plate 110 at its first bonding surface 132a, which is a surface at the +Y' axis side of the framing portion 132. The piezoelectric vibrating piece 130 is bonded to the base plate 120 at its second bonding surface 132b, which is a surface at the −Y' axis side of the framing portion 132. A first excitation electrode 134a is formed on a surface at the +Y' axis side of the excitation unit 131, while a second excitation electrode 134b is formed on a surface at the −Y' axis side of the excitation unit 131. A first extraction electrode 135a is extracted from the first excitation electrode 134a to the second bonding surface 132b of the framing portion 132 via a side face 133a at the +Z' axis side of the connecting portion 133. A second extraction electrode 135b is extracted from the second excitation electrode 134b to the second bonding surface 132b of the framing portion 132 via a surface at the −Y' axis side of the connecting portion 133.

The base plate 120 is arranged at the −Y' axis side of the piezoelectric vibrating piece 130. The base plate 120 is formed in a rectangular shape that has long sides in the X axis direction and short sides in the Z' axis direction. A pair of mounting terminals 124 are formed on a surface at the −Y' axis side of the base plate 120. The mounting terminals 124 are soldered and electrically connected to a printed circuit board or the like, by doing this, the piezoelectric device 100 is mounted on the printed circuit board or the like. Castellations 126 are formed on side faces at four corners of the base plate 120. Castellation electrodes 125 are formed at the respective castellations 126. A recess 121 is formed on a surface at the +Y' axis side of the base plate 120. A bonding surface 122 is formed in a peripheral area of the recess 121. Connecting electrodes 123 are formed on peripheral areas of the respective castellations 126 at the four corners of the bonding surface 122. These connecting electrodes 123 are electrically connected to the mounting terminals 124 via the castellation electrodes 125, which are formed on the castellations 126. The base plate 120 is bonded on the second bonding surface 132b of the framing portion 132 in the piezoelectric vibrating piece 130 via a sealing material 141 (see FIG. 2) at its bonding surface 122. The connecting electrodes 123 are electrically connected to the first extraction electrode 135a and the second extraction electrode 135b of the piezoelectric vibrating piece 130.

The lid plate 110 is arranged at the +Y' axis side of the piezoelectric vibrating piece 130. A recess 111 is formed on a surface at the −Y' axis side of the lid plate 110, and a bonding surface 112 is formed in a peripheral area of the recess 111. The lid plate 110 is bonded to the first bonding surface 132a of the framing portion 132 in the piezoelectric vibrating piece 130 via the sealing material 141 (see FIG. 2) at its bonding surface 112.

Figure 2:
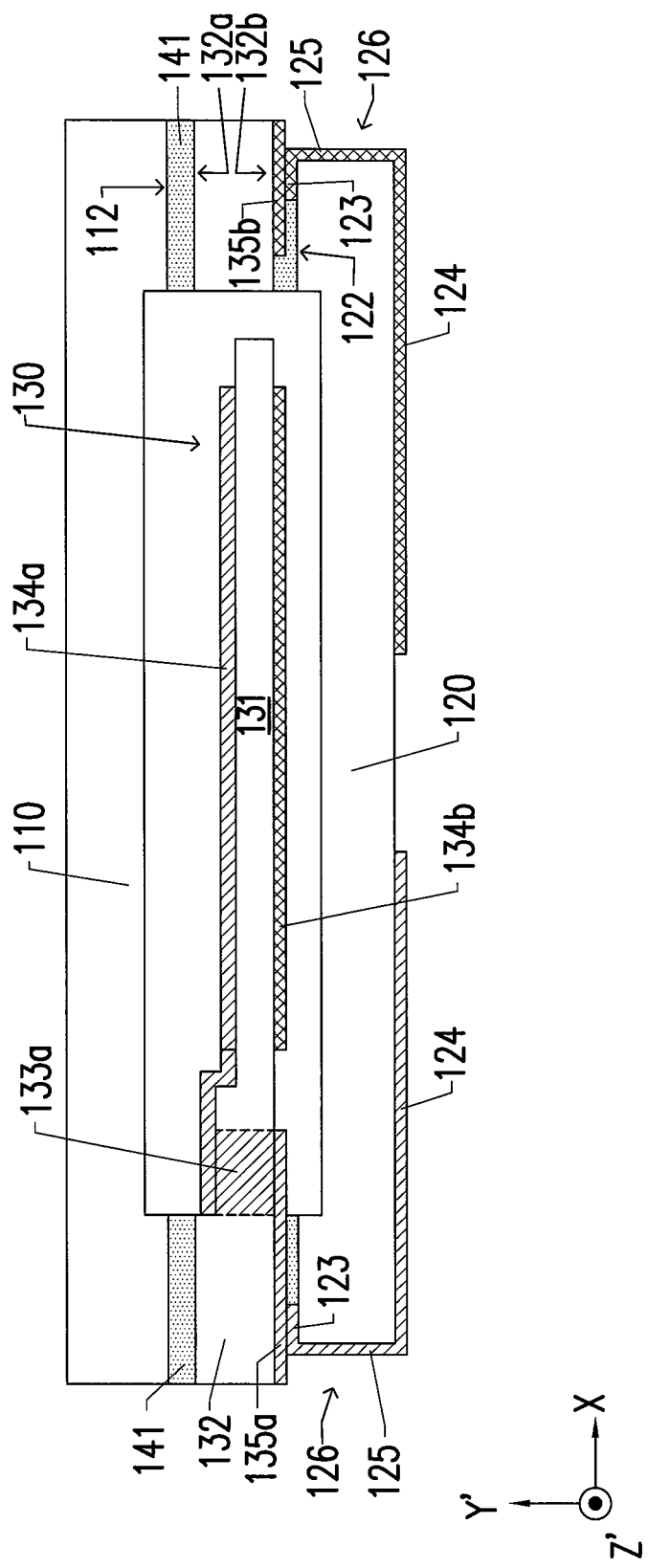
FIG. 2 is a cross-sectional view taken along the line A-A of FIG. 1.

FIG. 2 is a cross-sectional view taken along the line A-A of FIG. 1. In the piezoelectric device 100, the bonding surface 112 of the lid plate 110 is bonded to the first bonding surface 132a of the framing portion 132 in the piezoelectric vibrating piece 130 via the sealing material 141. In the piezoelectric device 100, the bonding surface 122 of the base plate 120 is bonded to the second bonding surface 132b of the framing portion 132 via the sealing material 141. When the piezoelectric vibrating piece 130 and the base plate 120 are bonded together, the first extraction electrode 135a and the second extraction electrode 135b, which are formed on the second bonding surface 132b of the framing portion 132, are electrically connected to the connecting electrodes 123, which are formed on the bonding surface 122 of the base plate 120. Accordingly, the first excitation electrode 134a is electrically connected to the mounting terminals 124 via the first extraction electrode 135a, the connecting electrodes 123, and the castellation electrodes 125, while the second excitation electrode 134b is electrically connected to the mounting terminals 124 via the second extraction electrode 135b, the connecting electrodes 123, and the castellation electrodes 125.

Figure 3A:
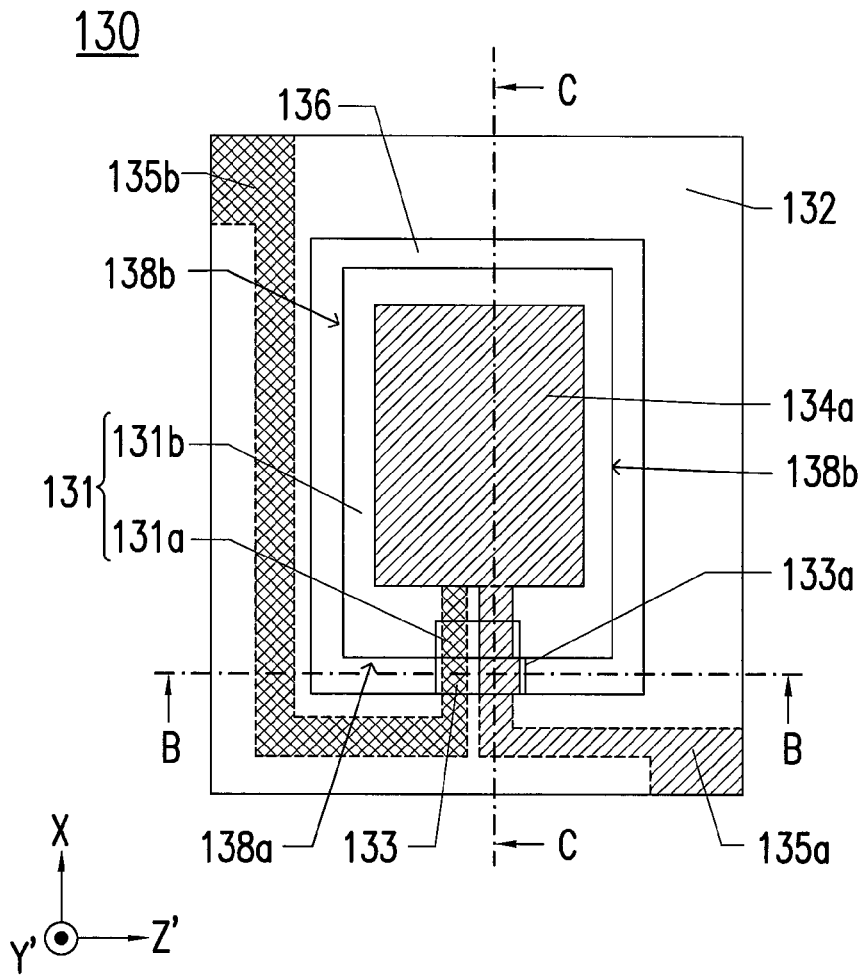
FIG. 3A is a plan view of a piezoelectric vibrating piece 130.

FIG. 3A is a plan view of the piezoelectric vibrating piece 130. The piezoelectric vibrating piece 130 includes the excitation unit 131 formed in a rectangular shape, the framing portion 132, which surrounds the excitation unit 131, and the one connecting portion 133, which connects the excitation unit 131 and the framing portion 132 together. The excitation unit 131 includes a first side 138a and second sides 138b. The first side 138a is the short side of the excitation unit 131 at the −X axis side of the excitation unit 131. The second sides 138b are long sides of the excitation unit 131 at the +Z' axis side and the −Z' axis side of the excitation unit 131. The connecting portion 133 is connected to the center of the first side 138a of the excitation unit 131, and extends in the −X axis direction so as to connect to the framing portion 132. And, regions other than the connecting portion 133 between the excitation unit 131 and the framing portion 132 constitute the through-hole 136 that passes through the piezoelectric vibrating piece 130 in the Y' axis direction. The excitation unit 131 is separated into a first region 131a and a second region 131b. The first region 131a is a region that is directly connected to the connecting portion 133. The second region 131b is a region other than the first region 131a on which the first excitation electrode 134a and the second excitation electrode 134b are formed. In the piezoelectric vibrating piece 130, the first region 131a is formed thicker than the second region 131b in the Y' axis direction. The first excitation electrode 134a is formed on the surface at the +Y' axis side of the excitation unit 131. The first extraction electrode 135a is extracted from the first excitation electrode 134a to a corner portion at the −X axis side and the +Z' axis side on the surface at the −Y' axis side of the framing portion 132 via the first region 131a, a surface at the +Y' axis side of the connecting portion 133, the side face 133a at the +Z' axis side of the connecting portion 133, and a surface at the −Y' axis side of the connecting portion 133. And, the second excitation electrode 134b (see FIG. 2) is formed on the surface at the −Y' axis side of the excitation unit 131. The second extraction electrode 135b is extracted from the second excitation electrode 134b to the framing portion 132 via a surface of the first region 131a and a surface of the connecting portion 133 at the −Y' axis side. The second extraction electrode 135b further extends on a surface at the −Y' axis side of the framing portion 132 in the −Z' axis direction and then in the +X axis direction. The second extraction electrode 135b is then extracted to a corner portion at the +X axis side and the −Z' axis side on a surface at the −Y' axis side of the framing portion 132. Since the second extraction electrode 135b is extracted to the +X axis side of the framing portion 132, the second extraction electrode 135b is formed longer than the first extraction electrode 135a.

Figure 3B:
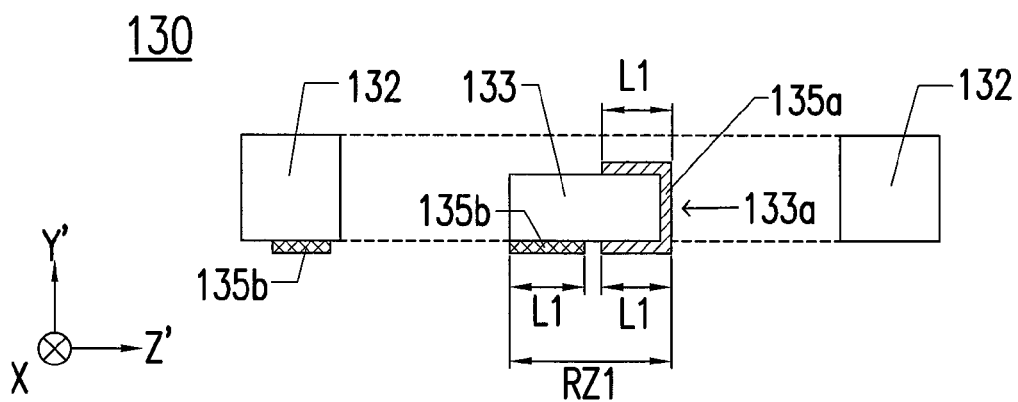
FIG. 3B is a cross-sectional view taken along the line B-B of FIG. 3A.

FIG. 3B is a cross-sectional view taken along the line B-B of FIG. 3A. FIG. 3B illustrates a cross-sectional view of the framing portion 132 and the connecting portion 133 in the Y'-Z' the plane. The first extraction electrode 135a extends from the first excitation electrode 134a, which is formed at the +Y' axis side of the excitation unit 131. The first extraction electrode 135a is extracted from the surface at the +Y' axis side of the connecting portion 133 to the surface at the −Y' axis side of the connecting portion 133 via the side face 133a. Widths of the first extraction electrode 135a in the Z' axis direction on respective surfaces at the +Y' axis side and at the −Y' axis side of the connecting portion 133 are formed to be a width L1. The second extraction electrode 135b extends from the second excitation electrode 134b, which is formed on the surface at the −Y' axis side of the excitation unit 131. The second extraction electrode 135b is extracted from the excitation unit 131 to the framing portion 132 via the surface at the −Y' axis side of the connecting portion 133. The second extraction electrode 135b is formed to have the width L1 in the Z' axis direction on the connecting portion 133. Assume that a width of the connecting portion 133 in the Z' axis direction is a width RZ1, the width RZ1 is larger than double of the width L1. The first extraction electrode 135a and the second extraction electrode 135b are formed on the connecting portion 133, so as not to face one another in the Z' axis direction or the Y' axis direction.

Figure 4A:
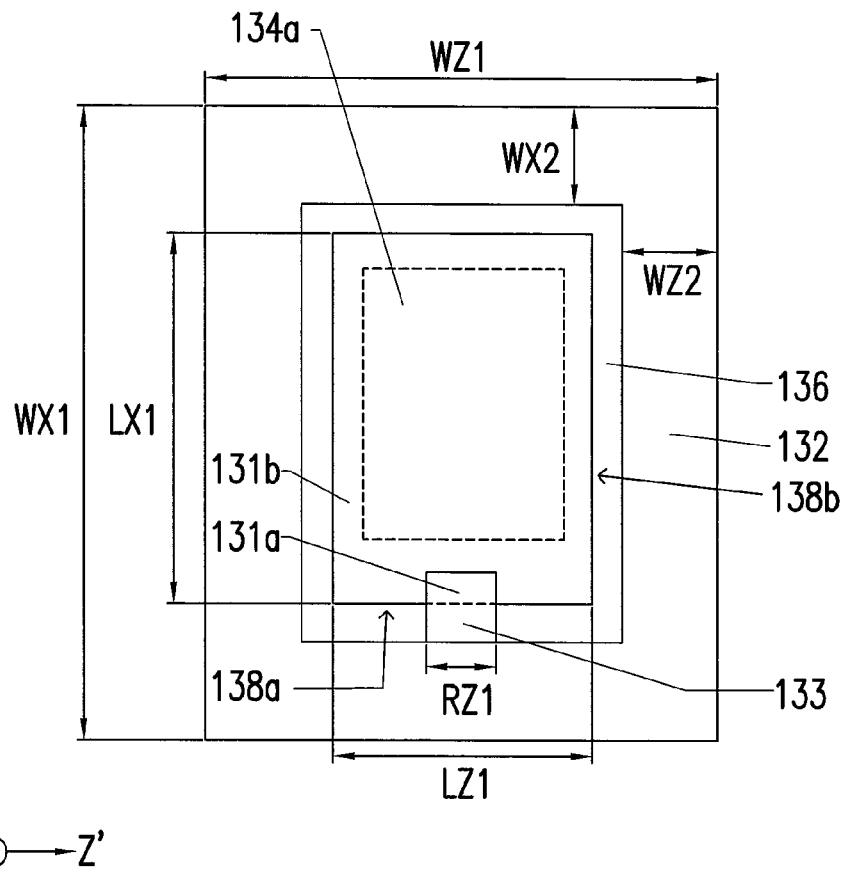
FIG. 4A is a plan view of the piezoelectric vibrating piece 130 without electrodes.

FIG. 4A is a plan view of the piezoelectric vibrating piece 130 on which electrodes are not formed. FIG. 4A illustrates a region on which the first excitation electrode 134a is formed as a reference. This region is surrounded by a dotted line. The first side 138a of the excitation unit 131 is formed to have a length LZ1, while the second side 138b is formed to have a length LX1. In the piezoelectric vibrating piece 130, the first side 138a is the short side of the excitation unit 131, while the second side 138b is the long side of the excitation unit 131. Thus, the length LZ1 is shorter than the length LX1. Assume that a whole length of the framing portion 132 in the X axis direction in the piezoelectric vibrating piece 130 is a length WX1, a whole length of the framing portion 132 in the Z' axis direction is a length WZ1, a length in the X axis direction of the framing portion 132 that extends in the Z' axis direction is a length WX2, and a length in the Z' axis direction of the framing portion 132 that extends in the X axis direction is a length WZ2. In the piezoelectric vibrating piece 130, for example, the respective lengths are as follows. The length LZ1 is 1.0 mm, the length LX1 is 1.4 mm, the length WX1 is 2.0 mm, the length WX2 is 0.2 mm, the length WZ1 is 1.6 mm, and the length WZ2 is 0.2 mm. Assume that a length in the Z' axis direction of the connecting portion 133 in the piezoelectric vibrating piece 130 is a width RZ1, the piezoelectric vibrating piece 130 is formed such that, for example, the width RZ1 is 0.2 mm.

Figure 4B:
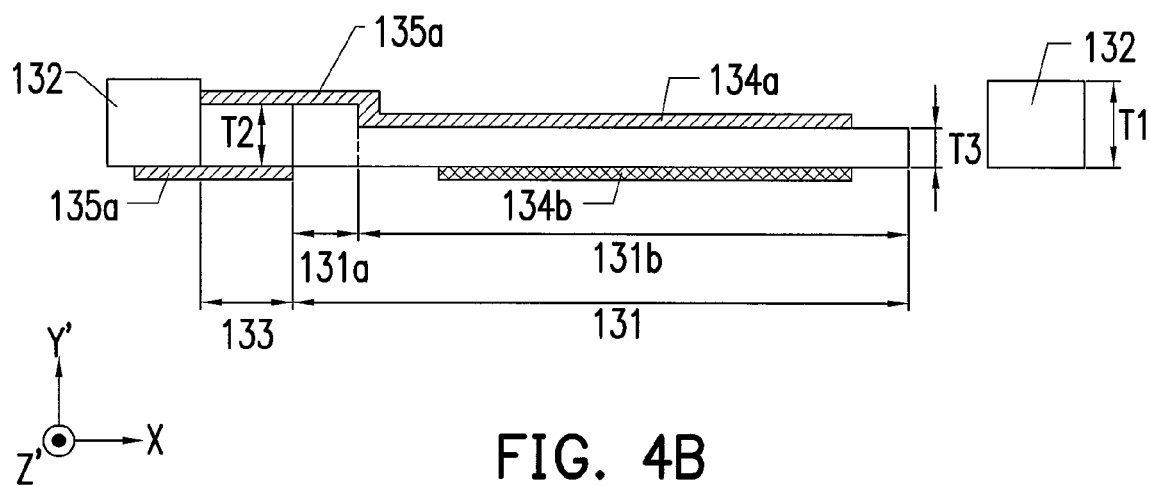
FIG. 4B is a cross-sectional view taken along the line C-C of FIG. 3A.

FIG. 4B is a cross-sectional view taken along the line C-C of FIG. 3A. The piezoelectric vibrating piece 130 is formed such that the framing portion 132 has a thickness of T1 in the Y' axis direction, the connecting portion 133 and the first region 131a of the excitation unit 131 have a thickness of T2 in the Y' axis direction, and the second region 131b of the excitation unit 131 has a thickness of T3 in the Y' axis direction. In the piezoelectric vibrating piece 130, the thickness T1 is formed to be thicker than the thickness T3, while the thickness T2 is equal to or less than the thickness T1 and larger than the thickness T3. Thus, the piezoelectric vibrating piece 130 is formed such that, for example, the thickness T1 is 80 μm, the thickness T2 is 70 μM, and the thickness T3 is 40 μm.

In the piezoelectric vibrating piece 130, as illustrated in FIG. 3B, the first extraction electrode 135a and the second extraction electrode 135b are formed on the connecting portion 133, so as not to face one another in the Y' and Z' axis directions. This reduces capacitance in the connecting portion 133 and avoids increase in crystal impedance (CI) value of the piezoelectric vibrating piece 130.

A Method for Manufacturing the Piezoelectric Device 100

A method for manufacturing the piezoelectric device 100 will be described by referring to a flowchart in FIG. 5.

Figure 5:
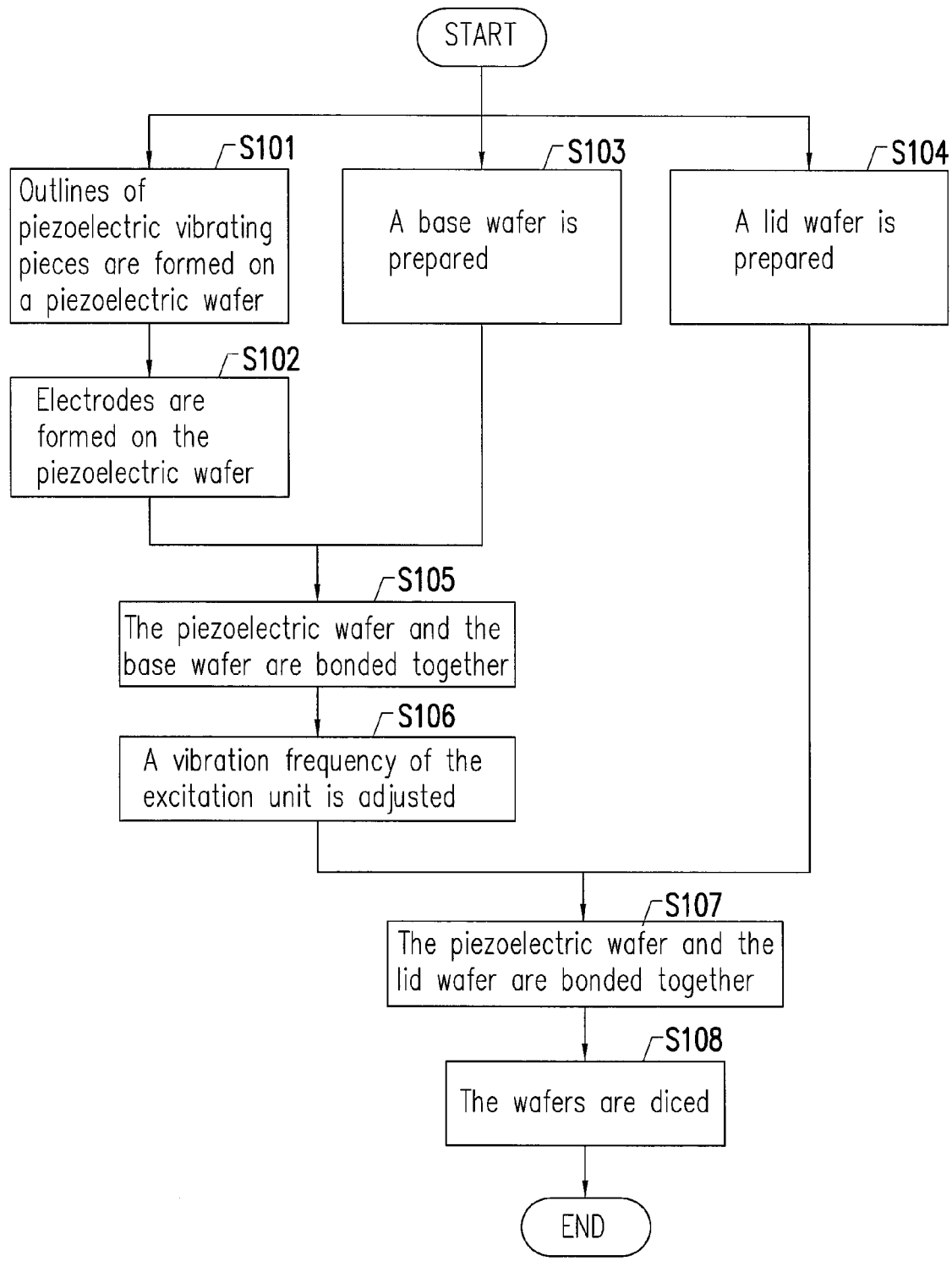
FIG. 5 is a flowchart illustrating a method for manufacturing the piezoelectric device 100.

FIG. 5 is a flowchart illustrating the method for manufacturing the piezoelectric device 100. In step S101, outlines of a plurality of piezoelectric vibrating pieces 130 are formed on a piezoelectric wafer W130. The piezoelectric wafer W130 is made of piezoelectric material. The outlines of the piezoelectric vibrating pieces 130 are formed as follows. First, a metal layer and a photoresist are formed on the piezoelectric wafer W130. Next, the photoresist is exposed and developed, and the metal layer is removed, thus exposing a part of the piezoelectric wafer W130. Then, the exposed regions of the piezoelectric wafer W130 are etched.

Figures 6A, 6B:
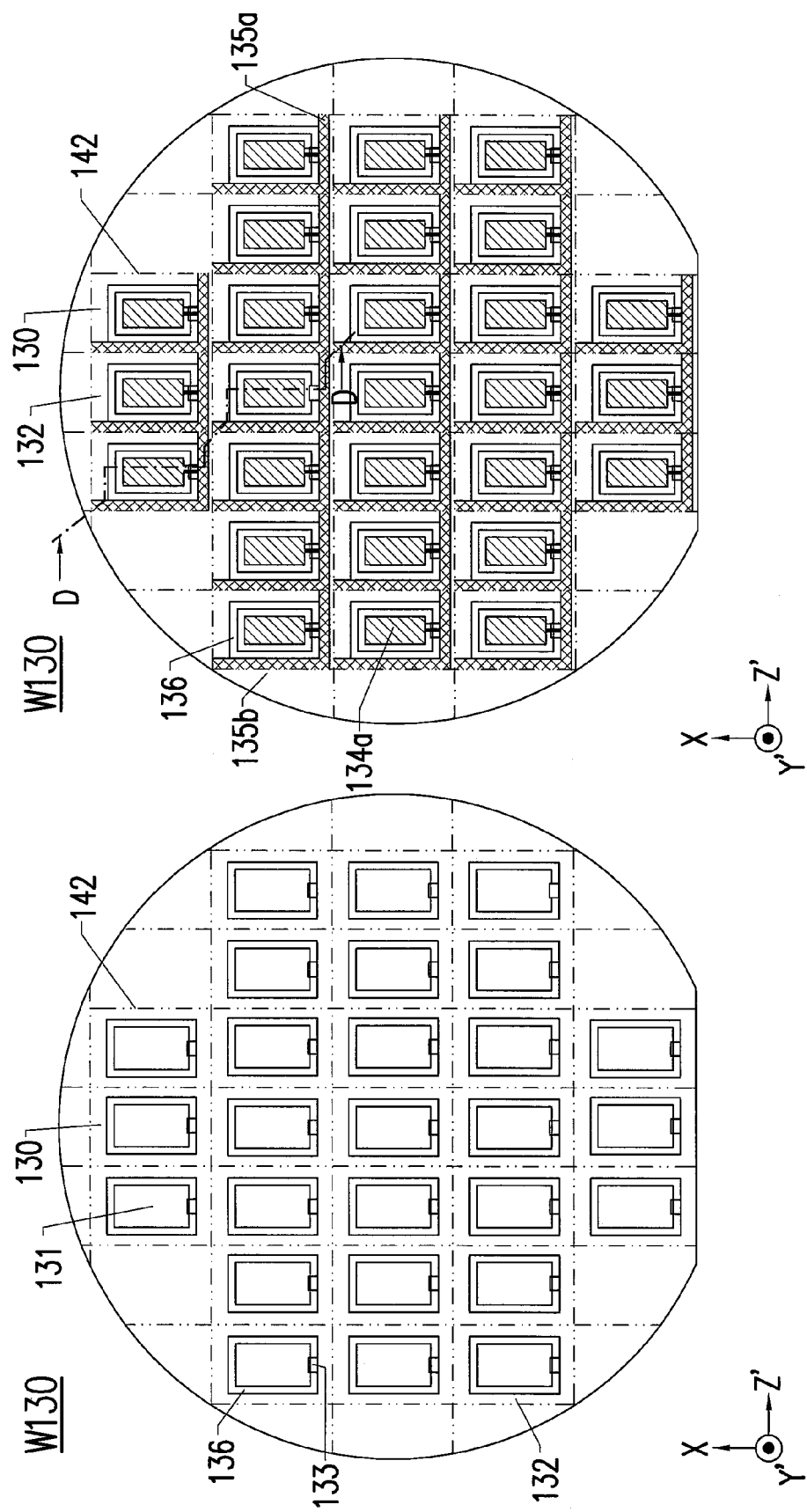
FIG. 6A is a plan view of a piezoelectric wafer W130 with outlines of the piezoelectric vibrating pieces 130.
FIG. 6B is a plan view of the piezoelectric wafer W130 with electrodes.

FIG. 6A is a plan view of the piezoelectric wafer W130 on which the outlines of the piezoelectric vibrating pieces 130 are formed. On the piezoelectric wafer W130, outlines of the plurality of piezoelectric vibrating pieces 130 are formed. On the piezoelectric wafer W130 illustrated in FIG. 6A, scribe lines 142 are illustrated by two-dot chain lines. The wafer is cut along the scribe lines 142 to dice the wafer in step S108 as described later. Each piezoelectric vibrating piece 130, which is illustrated on the piezoelectric wafer W130, is surrounded by the scribe lines 142. In the piezoelectric wafer W130 illustrated in FIG. 6A, the excitation unit 131, the connecting portion 133, and the through-hole 136 are formed by etching the piezoelectric wafer W130.

In step S102, electrodes are formed on the piezoelectric wafer W130. In step S102, the first excitation electrode 134a, the second excitation electrode 134b, the first extraction electrode 135a, and the second extraction electrode 135b are formed on each of the piezoelectric vibrating pieces 130 formed on the piezoelectric wafer W130. These electrodes are formed, for example, by forming a chromium (Cr) layer on the piezoelectric wafer W130 and evaporating a gold (Au) layer on a surface of the chromium layer.

FIG. 6B is a plan view of the piezoelectric wafer W130 on which the electrodes are formed. FIG. 6B illustrates the piezoelectric vibrating pieces 130 that each have the first excitation electrode 134a, the first extraction electrode 135a, and the second extraction electrode 135b. These electrodes are formed by evaporating the chromium (Cr) layer and the gold (Au) layer on surfaces at the +Y' axis side and the −Y' axis side of the piezoelectric wafer W130 via a mask (not shown).

In step S103, a base wafer W120 is prepared. A plurality of base plates 120 are formed on the base wafer W120. On the base wafer W120, first, the recesses 121 and through grooves 126a, which forms the castellations 126 later, (see FIG. 7A) are formed by etching. Then electrodes such as the connecting electrodes 123, the castellation electrodes 125, and the mounting terminals 124 are formed.

FIG. 7A is a plan view of the base wafer W120. In FIG. 7A, the scribe lines 142 are illustrated by two-dot chain lines. The respective base plates 120, which are formed on the base wafer W120, are surrounded by the scribe lines 142. Moreover, the scribe lines 142 that extend in the X axis direction of the base wafer W120 and the scribe lines 142 that extend in the Z' axis direction form intersection points. At the respective intersection points, the through grooves 126a are formed. The through grooves 126a pass through the base wafer W120 in the Y' axis direction and form the castellations 126 after the wafer is diced. On the base wafer W120, first, the recesses 121 and the through grooves 126a are formed by etching. Then, for example, the chromium layer and the gold layer form the mounting terminals 124, the castellation electrodes 125, which are formed on the through grooves 126a, and the connecting electrodes 123 on surfaces around the through grooves 126a at the +Y' axis side.

In step S104, a lid wafer W110 is prepared. On the lid wafer W110, a plurality of lid plates 110 are formed. The respective lid plates 110 on the lid wafer W110 are formed by forming the recess 111 using etching.

FIG. 7B is a plan view of the lid wafer W110. In FIG. 7B, two-dot chain lines represent the scribe lines 142. The respective lid plates 110 on the lid wafer W110 are surrounded by the scribe lines 142. The respective lid plates 110 are formed by etching the recesses 111 on the surface at the −Y' axis side of the lid wafer W110.

In step S105, the piezoelectric wafer W130 and the base wafer W120 are bonded together. In step S105, for example, the sealing material 141 (see FIG. 8A) is formed on the bonding surface 122 of the base wafer W120, and then the second bonding surface 132b of the piezoelectric wafer W130 is bonded to the bonding surface 122 of the base wafer W120. At the same time, the first extraction electrode 135a and the second extraction electrode 135b are electrically connected to the connecting electrodes 123.

FIG. 8A is a partial cross-sectional view of the piezoelectric wafer W130 and the base wafer W120. FIG. 8A illustrates a cross-sectional view taken along the respective lines D-D of FIG. 6B and FIG. 7A. The bonding surface 122 of the base wafer W120 and the second bonding surface 132b of the piezoelectric wafer W130 are bonded together with the sealing material 141. The first extraction electrode 135a and the second extraction electrode 135b of the piezoelectric wafer W130 are electrically connected to the connecting electrodes 123 of the base wafer W120.

In step S106, a vibration frequency of the excitation unit 131 is adjusted. The vibration frequency of the excitation unit 131 is adjusted by reverse sputtering performed on the first excitation electrode 134a, which is formed on the surface at the +Y' axis side of the excitation unit 131.

FIG. 8B is a partial cross-sectional view of the piezoelectric wafer W130 on which reverse sputtering is performed and the base wafer W120. FIG. 8B illustrates a cross-sectional view taken along the respective lines D-D of FIG. 6B and FIG. 7A. A vibration frequency of the excitation unit 131 is adjusted by reverse sputtering to thin the first excitation electrode 134a, which is formed on the surface at the +Y' axis side of the excitation unit 131. In reverse sputtering, regions other than the first excitation electrode 134a and its peripheral regions are covered with a mask 143, and gas ions are then collided against the first excitation electrode 134a while a voltage is applied to the excitation unit 131, so as to thin the first excitation electrode 134a. In FIG. 8B, a direction of the gas ions colliding against the first excitation electrode 134a is illustrated by white arrows 144. Assume that the first excitation electrode 134a has a thickness of RY1 (see FIG. 8A) before the reverse sputtering, and the first excitation electrode 134a of the excitation unit 131 has a thickness of RY2 after the reverse sputtering. The thickness RY2 is thinner than the thickness RY1. In the case where the first excitation electrode 134a before the reverse sputtering is formed to have the same thickness as that of the second excitation electrode 134b, the first excitation electrode 134a after the reverse sputtering has a thinner thickness than a thickness of the second excitation electrode 134b. Further, if the first extraction electrode 135a before the reverse sputtering is formed to have the same thickness as that of the second extraction electrode 135b, the first extraction electrode 135a after the reverse sputtering may have a thinner thickness than that of the second extraction electrode 135b due to, for example, displacement of the mask 143.

In step S107, the piezoelectric wafer W130 and the lid wafer W110 are bonded together. In step S107, for example, the sealing material 141 (see FIG. 8C) is formed on the first bonding surface 132a of the piezoelectric wafer W130, and the first bonding surface 132a of the piezoelectric wafer W130 is then bonded to the bonding surface 112 of the lid wafer W110.

FIG. 8C is a partial cross-sectional view of the piezoelectric wafer W130, the lid wafer W110, and the base wafer W120. FIG. 8C illustrates a cross-sectional view taken along the respective lines D-D of FIGS. 6B, 7A, and 7B. The bonding surface 112 of the lid wafer W110 and the first bonding surface 132a of the piezoelectric wafer W130 are bonded together by the sealing material 141. This forms a plurality of piezoelectric devices 100 in the piezoelectric wafer W130, the lid wafer W110, and the base wafer W120 that are bonded together.

In step S108, the wafers are diced. In step S108, the piezoelectric wafer W130, the lid wafer W110, and the base wafer W120 that are bonded together are diced along the scribe lines 142. Accordingly, the wafer is diced into the individual piezoelectric devices 100.

In the method for manufacturing the piezoelectric device 100 illustrated in the flowchart of FIG. 5, the reverse sputtering is performed on the first excitation electrode 134a in step S106. In the reverse sputtering, the mask 143 is placed over the piezoelectric wafer W130, and the mask 143 has an opening in a wider range than that of the first excitation electrode 134a in consideration of the displacement. Thus, the extraction electrodes, which are formed at the +Y' axis side of the piezoelectric vibrating piece 130, are possibly thinned by the reverse sputtering. In the piezoelectric vibrating piece 130, the first extraction electrode 135a is formed at the +Y' axis side. The first extraction electrode 135a is formed to have a short length, which is extracted from the first excitation electrode 134a to the second bonding surface 132b, thus ensuring low total electrical resistance. This makes influence of increase in electrical resistance of the first extraction electrode 135a due to thinning by the reverse sputtering be small. And, for the first excitation electrode 134a, the first extraction electrode 135a is formed on the surfaces at the +Y' axis side and the −Y' axis side and the side face 133a of the connecting portion 133. The reverse sputtering affects only a part of the first extraction electrode 135a that is formed on the surface at the +Y' axis side of the connecting portion 133. Accordingly, the reverse sputtering does not affects parts of the first extraction electrode 135a that are formed on the surface at the −Y' axis side of the connecting portion 133 and the side face 133a. The second extraction electrode 135b, which has a long length from the second excitation electrode 134b to the second bonding surface 132b, has higher electrical resistance than that of the first extraction electrode 135a. The second extraction electrode 135b is formed on the surface at the −Y' axis side of the piezoelectric vibrating piece 130, thus being insusceptible to the reverse sputtering. This reduces influence of the reverse sputtering on the first extraction electrode 135a and the second extraction electrode 135b in the piezoelectric vibrating piece 130, thus avoiding increase in crystal impedance (CI) value of the piezoelectric vibrating piece 130.

Second Embodiment

The piezoelectric vibrating piece may have the first extraction electrode that is thinned by the reverse sputtering and has an increased electrical resistance. In particular, the first extraction electrode that is formed adjacent to the first excitation electrode may be thinned by the reverse sputtering. Thus, the first extraction electrode formed adjacent to the first excitation electrode may have a large area. A piezoelectric vibrating piece 230 that includes the first extraction electrode with a large area adjacent to the first excitation electrode will be described below. In the following description, like reference numerals designate corresponding or identical elements of the piezoelectric vibrating piece 130 in FIG. 9, and therefore such elements will not be further elaborated here.

Configuration of the Piezoelectric Vibrating Piece 230

Figure 9:
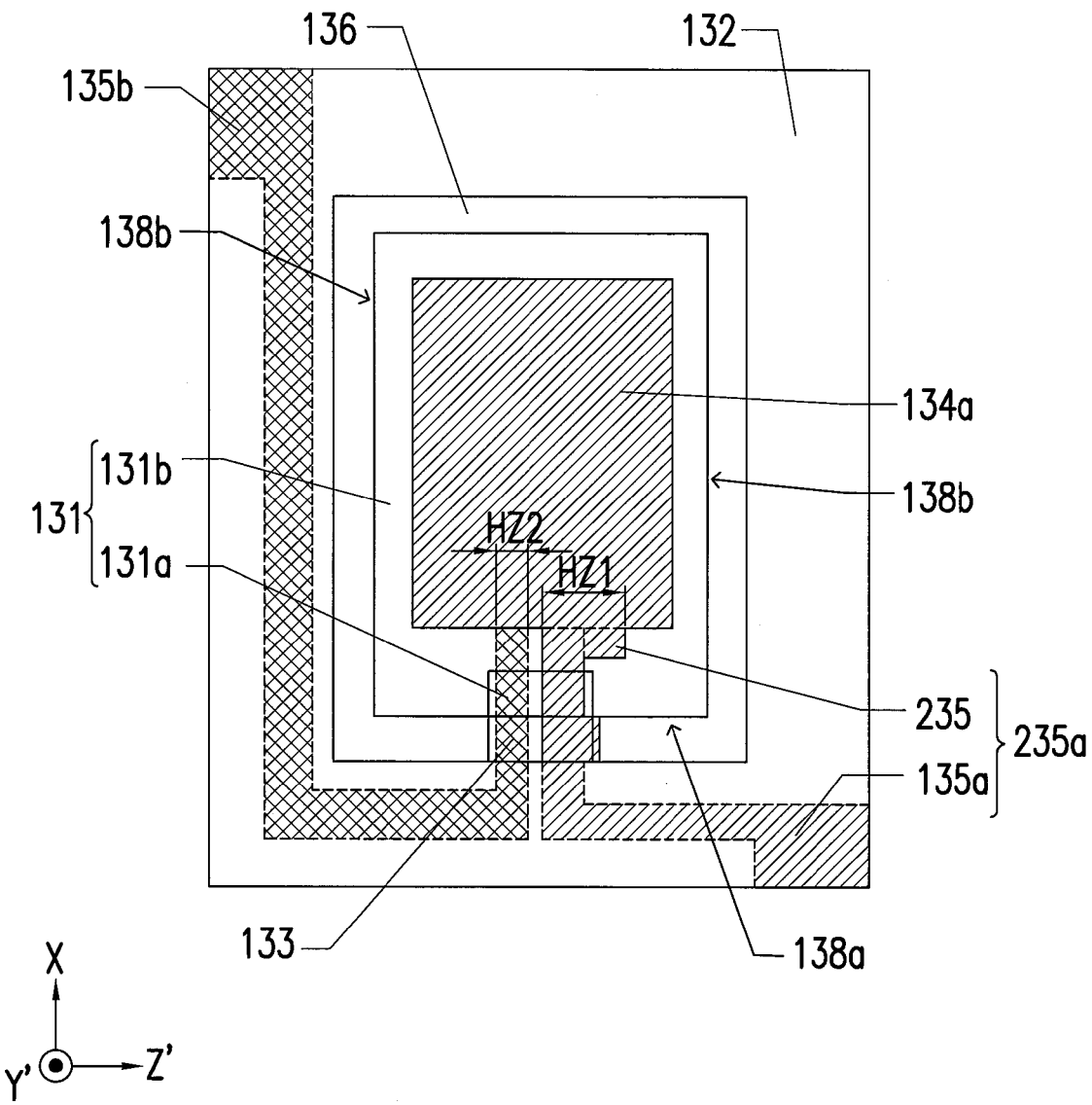
FIG. 9 is a plan view of a piezoelectric vibrating piece 230 according to a second embodiment.

FIG. 9 is a plan view of the piezoelectric vibrating piece 230. The piezoelectric vibrating piece 230 includes the excitation unit 131, the framing portion 132, and the connecting portion 133. In the piezoelectric vibrating piece 230, the first excitation electrode 134a is formed on a surface at the +Y' axis side of the excitation unit 131, and a first extraction electrode 235a is extracted from the first excitation electrode 134a. The first extraction electrode 235a is an extraction electrode, which is a combination of the first extraction electrode 135a (see FIG. 3A) and an electrode 235. The electrode 235 is an electrode on a surface at the +Y' axis side of the excitation unit 131. The electrode 235 is formed at the +Z' axis side of the first extraction electrode 135a. The electrode 235 is formed in a region next to the first excitation electrode 134a and the first extraction electrode 135a. The electrode 235 is formed in a position that does not overlap with the second extraction electrode 135b in the Y' axis direction. A width HZ1 is a width in the Z' axis direction of a portion where the first extraction electrode 235a and the first excitation electrode 134a are connected together. A width HZ2 is a width in the Z' axis direction of a portion where the second extraction electrode 135b and the second excitation electrode 134b are connected together. The width HZ1 is larger than the width HZ2.

In a piezoelectric vibrating piece, the reverse sputtering may thin a thickness of a first extraction electrode adjacent to a first excitation electrode, thus increasing electrical resistance of the first extraction electrode. In the piezoelectric vibrating piece 230, since the first extraction electrode 235a includes the electrode 235, the first extraction electrode 235a has a large area next to the first excitation electrode 134a. Thus, even if the thickness of the first extraction electrode 235a next to the first excitation electrode 134a is thinned by the reverse sputtering, the first extraction electrode 235a has a large area next to the first excitation electrode 134a. This avoids increase in electrical resistance of the first extraction electrode 235a.

Third Embodiment

In a piezoelectric vibrating piece, in the case where a first extraction electrode is extracted from a surface at the +Y' axis side to a surface at the −Y' axis side, the first extraction electrode passes through a side face of the piezoelectric vibrating piece. However, since it is difficult to form a thick electrode on the side face of the piezoelectric vibrating piece, the first extraction electrode may have an increased electrical resistance. Thus, the electrode on the side face of the piezoelectric vibrating piece may be formed to have a wide width. A piezoelectric vibrating piece that includes the first extraction electrode with a wide width on the side face of the piezoelectric vibrating piece will be described below.

Configuration of a Piezoelectric Vibrating Piece 330

FIG. 10A is a plan view of the piezoelectric vibrating piece 330. The piezoelectric vibrating piece 330 includes the excitation unit 131, the framing portion 132, and the connecting portion 133. And, in the excitation unit 131, the first excitation electrode 134a and the second excitation electrode 134b are respectively formed on the surface at the +Y' axis side and the surface the −Y' axis side of the excitation unit 131. A first extraction electrode 335a and the second extraction electrode 135b are respectively extracted from the first excitation electrode 134a and the second excitation electrode 134b. The first extraction electrode 335a includes a side-surface electrode 335. The side-surface electrode 335 is an electrode that is formed on the side face 133a at the +Z' axis side of the connecting portion 133, on a side face of the framing portion 132 intersecting with the side face 133a, and on a side face of the first side 138a intersecting with the side face 133a. The side-surface electrode 335 is formed on a side face of the through-hole 136 in the +Z' axis side of the connecting portion 133.

FIG. 10B is a partial plan view of the piezoelectric vibrating piece 330, illustrating electrodes on a surface at the +Y' axis side. FIG. 10B illustrates a half plan view of the piezoelectric vibrating piece 330 at the −X axis side. On the surface at the +Y' axis side, the first extraction electrode 335a is extracted from the first excitation electrode 134a to the side face 133a of the connecting portion 133, the first side 138a, and a side face, which is connected to the connecting portion 133, of the framing portion 132. And, the first extraction electrode 335a is formed only on the half of the piezoelectric vibrating piece 330 at the +Z' axis side, so as not to overlap with the second extraction electrode 135b in the Y' axis direction. The first extraction electrode 335a, which is formed on the surface at the +Y' axis side, is electrically connected to the side-surface electrode 335 and extracted from the surface at the +Y' axis side to the surface at the −Y' axis side.

FIG. 10C is a partial plan view of the piezoelectric vibrating piece 330, illustrating electrodes on the surface at the −Y' axis side. FIG. 10C illustrates a half plan view of the piezoelectric vibrating piece 330 at the −X axis side. On the surface at the −Y' axis side of the piezoelectric vibrating piece 330, the first extraction electrode 335a is extracted from the side-surface electrode 335 to a corner portion at the −X axis side and the +Z' axis side of the framing portion 132. The first extraction electrode 335a is extracted via the first side 138a of the excitation unit 131, a side in contact with the side face 133a of the connecting portion 133, a side that is connected to the connecting portion 133 in the framing portion 132.

In the piezoelectric vibrating piece 330, the first extraction electrode 335a is extracted from the surface at the +Y' axis side to the surface at the −Y' axis side via the side-surface electrode 335. The side-surface electrode 335 is disposed on the side face 133a of the connecting portion 133, the side face of the first side 138a, and the side face of the framing portion 132. The side-surface electrode 335 has a long length in the X–Z' plane. That is, the side-surface electrode 335 is formed to have a large width, thus avoiding increase in electrical resistance of the first extraction electrode 335a caused by the reduced thickness of the side-surface electrode 335. And, as illustrated in FIG. 10B, the first extraction electrode 335a, which is formed on the surface at the +Y' axis side of the piezoelectric vibrating piece 330, extends to the +Z' axis side of the piezoelectric vibrating piece 330. Thus, verifying the first extraction electrode 335a on the surface at the +Y' axis side extends to either the +Z' axis direction or—the Z' axis direction allows to determine this surface of the piezoelectric vibrating piece 330 is either the surface at the +Y' axis side or the surface at the −Y' axis side.

Configuration of a Piezoelectric Vibrating Piece 430

Figure 11A:
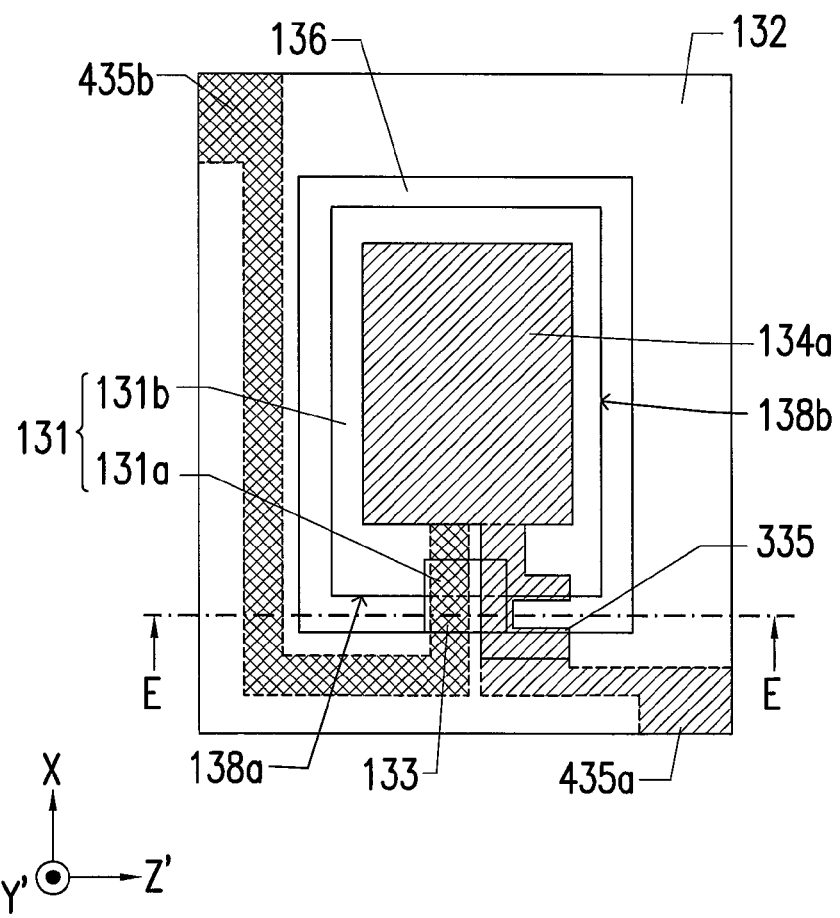
FIG. 11A is a plan view of a piezoelectric vibrating piece 430.

FIG. 11A is a plan view of the piezoelectric vibrating piece 430. The piezoelectric vibrating piece 430 includes the excitation unit 131, the framing portion 132, and the connecting portion 133. In the excitation unit 131, the first excitation electrode 134a and the second excitation electrode 134b are respectively formed on the surface at the +Y' axis side and the surface at the −Y' axis side of the excitation unit 131. A first extraction electrode 435a and a second extraction electrode 435b are respectively extracted from the first excitation electrode 134a and the second excitation electrode 134b. The first extraction electrode 435a is extracted from the first excitation electrode 134a to a peripheral area of the side-surface electrode 335 on the surface at the +Y' axis side, and is then extracted to the surface at the −Y' axis side via the side-surface electrode 335. Further, the first extraction electrode 435a is further extracted to a corner portion at the −X axis side and the +Z' axis side on the surface at the −Y' axis side of the framing portion 132. The second extraction electrode 435b is formed from the second excitation electrode 134b to a corner portion at the +X axis side and the −Z' axis side on the surface at the −Y' axis side of the framing portion 132 via the connecting portion 133.

Figure 11B:
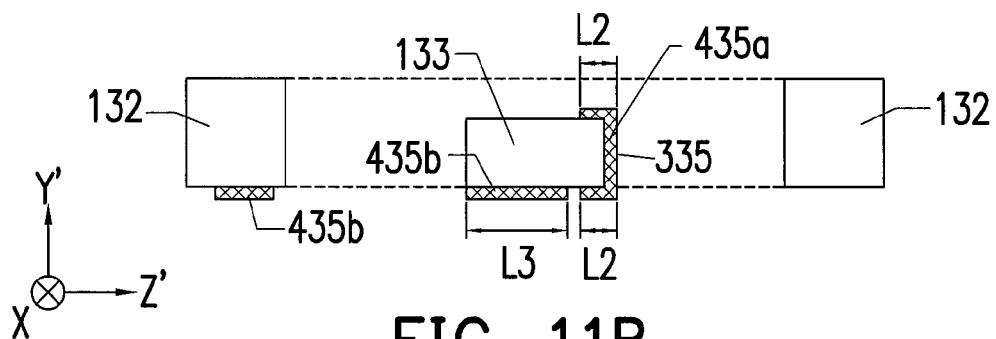
FIG. 11B is a cross-sectional view taken along the line E-E of FIG. 11A.

FIG. 11B is a cross-sectional view taken along the line E-E of FIG. 11A. In the piezoelectric vibrating piece 430, the first extraction electrode 435a on the connecting portion 133 has a width L2 in the Z' axis direction on the surface of at the +Y' axis side, and has the width L2 in the Z' axis direction on the surface at the −Y' axis side. The second extraction electrode 435b on the connecting portion 133 has a width L3 in the Z' axis direction, which is larger than the width L2. Further, in the piezoelectric vibrating piece 430, the first extraction electrode 435a is an only electrode formed on the surface at the +Y' axis side of the connecting portion 133, while the first extraction electrode 435a and the second extraction electrode 435b are formed on the surface at the −Y' axis side. That is, an area of electrode formed on the surface at the +Y' axis side of the connecting portion 133 is smaller than areas of the electrodes formed on the surface at the −Y' axis side of the connecting portion 133.

In the case where the connecting portion of the piezoelectric vibrating piece is formed to have a narrow width in the Z' axis direction, areas of the extraction electrodes formed on the connecting portion are also small. At this time, the reverse sputtering performed on the piezoelectric vibrating piece increases electrical resistances of the extraction electrodes formed on the surface at the +Y' axis side of the connecting portion. In the piezoelectric vibrating piece 430, the electrodes formed on the surface at the +Y' axis side of the connecting portion 133 are formed to have small area, thus being insusceptible to the reverse sputtering. The first extraction electrode 435a is also formed on the side face of the connecting portion 133, thus ensuring an area at the connecting portion 133.

Configuration of a Piezoelectric Vibrating Piece 530

Figure 12A:
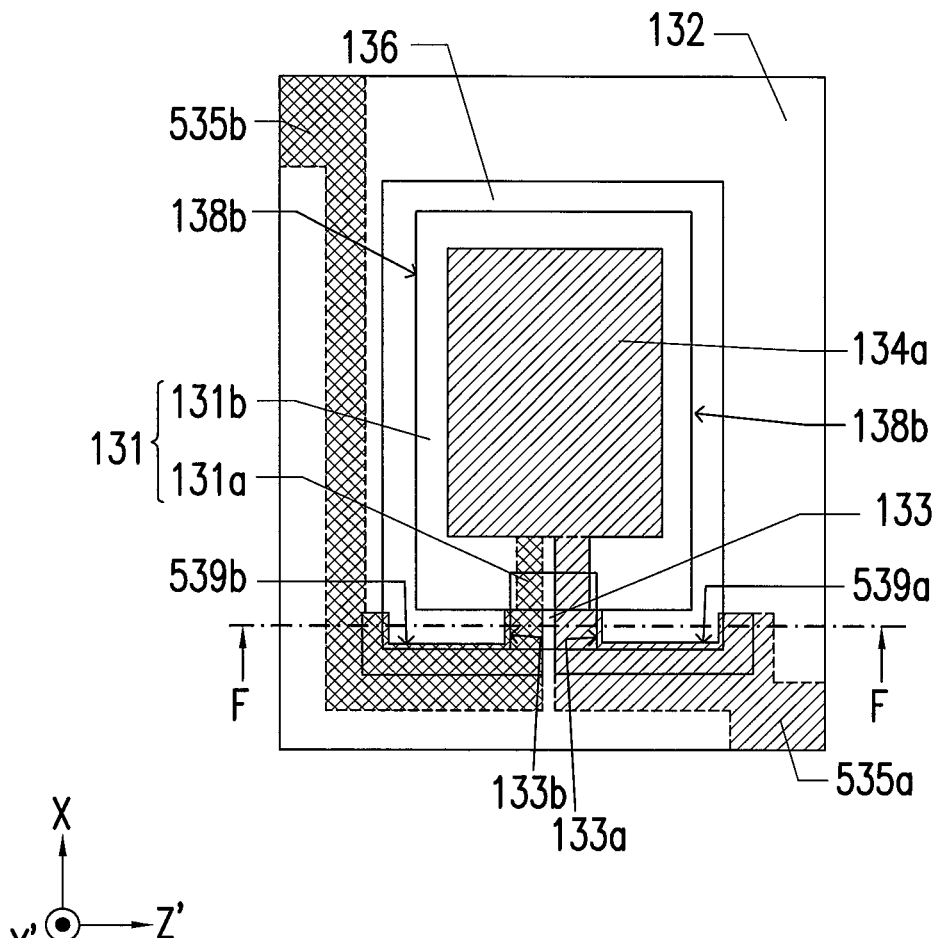
FIG. 12A is a plan view of a piezoelectric vibrating piece 530.

FIG. 12A is a plan view of the piezoelectric vibrating piece 530. The piezoelectric vibrating piece 530 includes the excitation unit 131, the framing portion 132, and the connecting portion 133. In the excitation unit 131, the first excitation electrode 134a and the second excitation electrode 134b are respectively formed on the surface at the +Y' axis side and the surface at the −Y' axis side of the excitation unit 131. A first extraction electrode 535a and a second extraction electrode 535b are respectively extracted from the first excitation electrode 134a and the second excitation electrode 134b. The first extraction electrode 535a extends from the first excitation electrode 134a in the −X axis direction on the surface at the +Y' axis side of the piezoelectric vibrating piece 530. Then, the first extraction electrode 535a is extracted to a side at the +Z' axis side of the connecting portion 133, a side that faces the through-hole 136 in the +X axis direction in the framing portion 132, and a side that faces the through-hole 136 in the −Z' axis direction in the framing portion 132. Further, the first extraction electrode 535a is extracted to the surface at the −Y' axis side via a side-surface electrode 539a formed on the side face of the through-hole 136, and then extends to a corner portion at the −X axis side and +Z' axis side on the surface at the −Y' axis side of the framing portion 132. The side-surface electrode 539a is formed on the side face 133a at the +Z' axis side of the connecting portion 133. The side-surface electrode 539a is also formed on the side face that faces the through-hole 136 in the +X axis direction in the framing portion 132, at the +Z' axis side of the connecting portion 133. The side-surface electrode 539a is also formed on the side face that faces the through-hole 136 in the −Z' axis direction in the framing portion 132 at the −X axis side. The second extraction electrode 535b extends from the second excitation electrode 134b in the −X axis direction, and then extracted to the framing portion 132 via the connecting portion 133. Further, the second extraction electrode 535b extends along the framing portion 132 in the −Z' axis direction and then in the +X axis direction. The second extraction electrode 535b is then formed to a corner portion at the +X axis side and the −Z' axis side on the surface at the −Y' axis side of the framing portion 132. The second extraction electrode 535b is also formed at the side-surface electrode 539b and on peripheral areas of the side-surface electrode 539b on the surface at the +Y' axis side of the piezoelectric vibrating piece 530. The side-surface electrode 539b is formed on a side face 133b at the −Z' axis side of the connecting portion 133. The side-surface electrode 539b is also formed on the side face that faces the through-hole 136 in the +X axis direction in the framing portion 132 in the −Z' axis side of the connecting portion 133. The side-surface electrode 539b is also formed on the side face that faces the through-hole 136 in the +Z' axis direction in the framing portion 132 at the −X axis side. The side-surface electrode 539b is also formed on the surface at the +Y' axis side of the piezoelectric vibrating piece 530. The side-surface electrode 539b on the surface at the +Y' axis side is formed along the side at the −Z' axis side of the connecting portion 133. The side-surface electrode 539b on the surface at the +Y' axis side is also formed along a side that faces the through-hole 136 in the +X axis direction in the framing portion 132 at the −Z' axis side. The side-surface electrode 539b on the surface at the +Y' axis side is also formed along a side that faces the through-hole 136 in the +Z' axis direction in the framing portion 132 at the −X axis side.

Figure 12B:
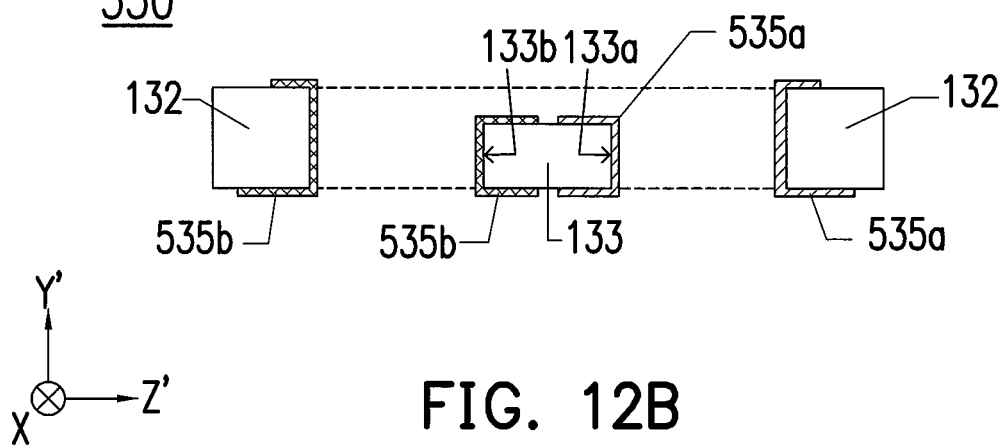
FIG. 12B is a cross-sectional view taken along the line F-F of FIG. 12A.

FIG. 12B is a cross-sectional view taken along the line F-F of FIG. 12A. The first extraction electrode 535a and the second extraction electrode 535b are each formed on the surface at the +Y' axis side and the surface at the −Y' axis side of the connecting portion 133, and respectively formed on the side face 133a and the side face 133b of the connecting portion 133. The first extraction electrode 535a and the second extraction electrode 535b are each formed on the surface at the +Y' axis side of the framing portion 132, the surface at the −Y' axis side of the framing portion 132, and the side faces at the through-hole 136 side of the framing portion 132. Further, the first extraction electrode 535a and the second extraction electrode 535b do not overlap with one another in the Y' axis direction at the connecting portion 133.

In the piezoelectric vibrating piece 530, the first extraction electrode 535a and the second extraction electrode 535b are formed on the surface at the +Y' axis side, the surface at the −Y' axis side, and the side faces of the connecting portion 133. This forms large areas of the first extraction electrode 535a and the second extraction electrode 535b at the connecting portion 133. Thus, even if the connecting portion 133 has a small width in the Z' axis direction, this minimizes increase in electrical resistance caused by the decreased areas of extraction electrodes.

Configuration of a Piezoelectric Vibrating Piece 630

FIG. 13A is a plan view of the piezoelectric vibrating piece 630. The piezoelectric vibrating piece 630 includes an excitation unit 631, the framing portion 132, and the connecting portion 133. The excitation unit 631 is formed in a rectangular shape that includes the first side 138a and the second sides 138b. The excitation unit 631 is separated into a first region 131a, a third region 131c, and a fourth region 131d. The first region 131a is a region that is directly connected to the connecting portion 133. The third region 131c is a region where the first excitation electrode 134a and the second excitation electrode 134b are formed. The fourth region 131d is a region other than the first region 131a and the third region 131c, and is formed between the first region 131a and the third region 131c. The piezoelectric vibrating piece 630 is a mesa-type piezoelectric vibrating piece. In the piezoelectric vibrating piece 630, the third region 131c, on which the first excitation electrode 134a and the second excitation electrode 134b are formed, is thicker than the fourth region 131d, which surrounds the third region 131c, in the Y' axis direction. And, a first extraction electrode 635a and a second extraction electrode 635b are respectively extracted from the first excitation electrode 134a and the second excitation electrode 134b, which are formed on the third region 131c of the excitation unit 631, to the framing portion 132.

FIG. 13B is a cross-sectional view taken along the line G-G of FIG. 13A. The piezoelectric vibrating piece 630 has, for example, a thickness of T2 in the Y' axis direction at the third region 131c of the excitation unit 631 and a thickness of T3 in the Y' axis direction at the fourth region 131d. Thicknesses in the Y' axis direction of the connecting portion 133, the framing portion 132, and the first region 131a are respectively formed to be the thickness T2, the thickness T1, and the thickness T2, similarly to the piezoelectric vibrating piece 130 illustrated in FIG. 4B.

FIG. 13C is a partial plan view of the piezoelectric vibrating piece 630 illustrating electrodes on the surface at the +Y' axis side. FIG. 13C illustrates a half plan view of the piezoelectric vibrating piece 630 at the −X axis side. The first extraction electrode 635a is extracted from the first excitation electrode 134a on the surface at the +Y' axis side. Then, the first extraction electrode 635a on the surface at the +Y' axis side is formed along the side face 133a of the connecting portion 133. The first extraction electrode 635a on the surface at the +Y' axis side is also formed along the first side 138a in the +Z' axis side of the connecting portion 133 and the second side 138b at the −X axis side in the +Z' axis side of the connecting portion 133. The first extraction electrode 635a on the surface at the +Y' axis side is also formed along a side that faces the through-hole 136 at the +X axis side of the framing portion 132 in the +Z' axis side of the connecting portion 133. The first extraction electrode 635a on the surface at the +Y' axis side is also formed along a side that faces the through-hole 136 in the −Z' axis direction in the framing portion 132 at the −X axis side. The second extraction electrode 635b is formed along the side face 133b of the connecting portion 133, the first side 138a in the −Z' axis side of the connecting portion 133 and the second side 138b at the −X axis side in the −Z' axis side of the connecting portion 133. The second extraction electrode 635b is also formed along a side that faces the through-hole 136 at the +X axis side of the framing portion 132 in the −Z' axis side of the connecting portion 133. The second extraction electrode 635b is also formed along a side that faces the through-hole 136 at the +Z' axis side of the framing portion 132 at the −X axis side. The second extraction electrode 635b is then connected to a side-surface electrode 639b. The first extraction electrode 635a includes a portion that is formed on the surface at the +Y' axis side of the piezoelectric vibrating piece 630 and extracted to the surface at the −Y' axis side via a side-surface electrode 639a, which is formed at the side face of the through-hole 136. The side-surface electrode 639a is formed on the side face 133a at the +Z' axis side of the connecting portion 133, the first side 138a in the +Z' axis side of the connecting portion 133, and the second side 138b at the −X axis side in the +Z' axis side of the connecting portion 133. The side-surface electrode 639a is also formed on a side face that faces the through-hole 136 in the +X axis direction of the framing portion 132 in the +Z' axis side of the connecting portion 133. The side-surface electrode 639a is also formed on a side face that faces the through-hole 136 in the −Z' axis direction of the framing portion 132 at the −X axis side. The side-surface electrode 639b is formed on the side face 133b at the −Z' axis side of the connecting portion 133. The side-surface electrode 639b is also formed on the first side 138a in the −Z' axis side of the connecting portion 133 and the second side 138b at the −X axis side in the −Z' axis side of the connecting portion 133. The side-surface electrode 639b is also formed on a side face that faces the through-hole 136 in the +X axis direction of framing portion 132 in the −Z' axis side of the connecting portion 133. The side-surface electrode 639b is also formed on a side face that faces the through-hole 136 in the +Z' axis direction of the framing portion 132 at the −X axis side.

FIG. 13D is a partial plan view of the piezoelectric vibrating piece 630 illustrating electrodes on the surface at the −Y' axis side. FIG. 13D illustrates a half plan view of the piezoelectric vibrating piece 630 at the −X axis side. The first extraction electrode 635a is extracted on the surface at the −Y' axis side from the side-surface electrode 639a to a peripheral area of the side-surface electrode 639a on the surface at the −Y' axis side of the piezoelectric vibrating piece 630. Further, the first extraction electrode 635a is extracted to a corner portion at the −X axis side and the +Z' axis side of the framing portion 132. The second extraction electrode 635b extends in the −X axis direction from the second excitation electrode 134b and is extracted to the framing portion 132. The second extraction electrode 635b then extends in the −Z' axis direction and the +X axis direction, and is extracted to a corner portion at the +X axis side and the −Z' axis side of the framing portion 132. The second extraction electrode 635b is also extracted to a peripheral area of the side-surface electrode 639b on the surface at the −Y' axis side, and electrically connected to the second extraction electrode 635b, which is formed at the +Y' axis side, via the side-surface electrode 639b.

The piezoelectric vibrating piece 630 is formed to have large areas of the side-surface electrodes. Thus, even if the connecting portion 133 is formed to have a small width in the Z' axis direction, this minimizes increase in electrical resistance due to decreased area of the extraction electrodes formed on the connecting portion 133. This also avoids increase in electrical resistances of the side-surface electrodes, which tend to be thin and have high electrical resistance.

Configuration of a Piezoelectric Vibrating Piece 730

Figure 14A:
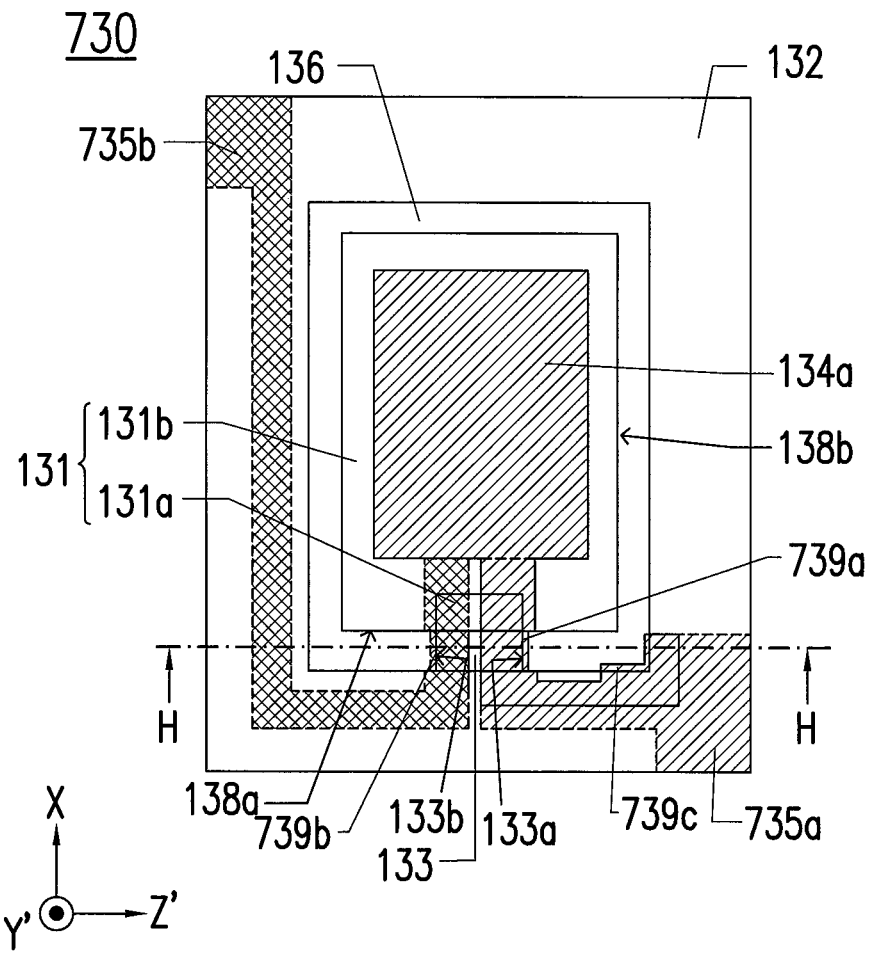
FIG. 14A is a plan view of a piezoelectric vibrating piece 730.

FIG. 14A is a plan view of the piezoelectric vibrating piece 730. The piezoelectric vibrating piece 730 includes the excitation unit 131, the framing portion 132, and the connecting portion 133. In the excitation unit 131, the first excitation electrode 134a and the second excitation electrode 134b are respectively formed on the surface at the +Y' axis side and the surface at the −Y' axis side of the excitation unit 131. A first extraction electrode 735a and a second extraction electrode 735b are respectively extracted from the first excitation electrode 134a and the second excitation electrode 134b. The first extraction electrode 735a is extracted from the first excitation electrode 134a to a corner portion at the −X axis side and the +Z' axis side that faces the through-hole 136 of the framing portion 132. Further, the first extraction electrode 735a is extracted to the surface at the −Y' axis side via a side-surface electrode 739c that is formed on a side face of the framing portion 132. This side face includes a corner portion at the −X axis side and the +Z' axis side that faces the through-hole 136. The first extraction electrode 735a extends to a corner portion at the +Z' axis side and the −X axis side of the framing portion 132. The second extraction electrode 735b extends from the second excitation electrode 134b to the framing portion 132 via the connecting portion 133. Further, the second extraction electrode 735b extends in the −Z' axis direction and the +X axis direction along the surface at the −Y' axis side of the framing portion 132. The second extraction electrode 735b extends to a corner portion at the +X axis side and the −Z' axis side of the framing portion 132. The first extraction electrode 735a and the second extraction electrode 735b respectively includes a side-surface electrode 739a, which is formed on the side face 133a of the connecting portion 133, and a side-surface electrode 739b, which is formed on the side face 133b of the connecting portion 133.

Figure 14B:
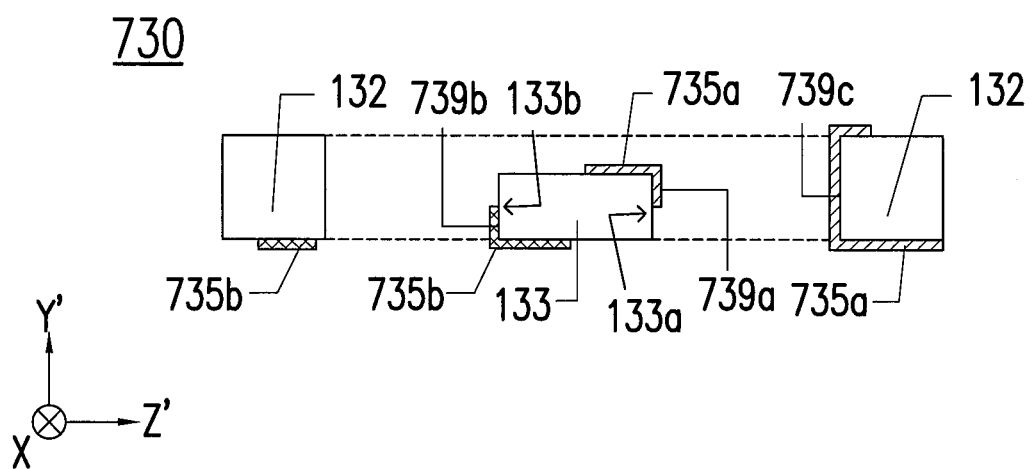
FIG. 14B is a cross-sectional view taken along the line H-H of FIG. 14A.

FIG. 14B is a cross-sectional view taken along the line H-H of FIG. 14A. The first extraction electrode 735a and the second extraction electrode 735b respectively include the side-surface electrode 739a and the side-surface electrode 739b on the connecting portion 133. The side-surface electrode 739a is formed on the half of the side face 133a at the +Y' axis side of the connecting portion 133, while the side-surface electrode 739b is formed on the half of the side face 133b at the −Y' axis side of the connecting portion 133. The first extraction electrode 735a and the second extraction electrode 735b do not overlap with one another in the Y' axis direction or the Z' axis direction at the connecting portion 133.

In the piezoelectric vibrating piece 730, the first extraction electrode 735a and the second extraction electrode 735b, which are formed on the connecting portion 133, do not overlap with one another in the Y' axis direction or the Z' axis direction at the connecting portion. Thus, in the piezoelectric vibrating piece 730, the first extraction electrode 735a and the second extraction electrode 735b do not generate capacitance at the connecting portion 133. The first extraction electrode 735a and the second extraction electrode 735b each preferably have a large area at the connecting portion 133 because the electrodes are also formed on the side faces of the connecting portion 133.

Representative embodiments have been described in detail above. As evident to those skilled in the art, the present invention may be changed or modified in various ways within the technical scope of the invention.

For example, while only the piezoelectric vibrating piece 630 is described as a mesa-type piezoelectric vibrating piece, the other piezoelectric vibrating pieces may be formed as mesa-type piezoelectric vibrating pieces.

While in the embodiments the piezoelectric vibrating pieces are AT-cut quartz-crystal vibrating pieces, for example, a BT-cut quartz-crystal vibrating piece that vibrates in a thickness-shear vibration mode may also be used, similarly to the AT-cut quartz-crystal vibrating pieces. Further, the piezoelectric vibrating pieces are basically applied to piezoelectric material including not only quartz-crystal material but also lithium tantalite, lithium niobate, and piezoelectric ceramic.

What is claimed is:

1. A piezoelectric vibrating piece to be bonded to and sandwiched between a lid plate and a base plate with an external electrode, the piezoelectric vibrating piece having a first main surface at the lid plate side and a second main surface at the base plate side, the piezoelectric vibrating piece comprising:

an excitation unit in a rectangular shape, including a first side and a second side, the first side extending in a first direction, the second side extending in a second direction perpendicular to the first direction;

a first excitation electrode, on the first main surface of the excitation unit;

a second excitation electrode, on the second main surface of the excitation unit;

a framing portion, including a first bonding surface and a second bonding surface, the first bonding surface being a surface to be bonded to the lid plate, the second bonding surface being a surface to be bonded to the base plate, the framing portion surrounding the excitation unit;

one connecting portion, connecting the first side of the excitation unit and the framing portion together, the connecting portion including a planar surface parallel to both the main surfaces and a side face intersecting with the planar surface;

a first extraction electrode, being extracted from the first excitation electrode to the second bonding surface of the framing portion via the connecting portion; and a second extraction electrode, being extracted from the second excitation electrode to the second bonding surface of the framing portion via the connecting portion, wherein, the first extraction electrode is disposed on at least a part of the side face of the connecting portion, and the first extraction electrode is extracted to the framing portion.

2. The piezoelectric vibrating piece according to claim 1, wherein, the first extraction electrode and the second extraction electrode do not overlap with one another in a confronting direction of the planar surfaces or in a confronting direction of the side faces of the connecting portion.

3. The piezoelectric vibrating piece according to claim 2, wherein, the first extraction electrode is disposed on the side face of the connecting portion, the first main surface, and the second main surface, and the second extraction electrode is disposed only on the second main surface of the connecting portion.

4. The piezoelectric vibrating piece according to claim 3, wherein, a width of the first extraction electrode on the second main surface of the connecting portion in the confronting direction of the side faces is smaller than a width of the second extraction electrode on the second main surface of the connecting portion in the confronting direction of the side faces.

5. The piezoelectric vibrating piece according to claim 1, wherein, the first extraction electrode has a first length extracted from one end of the first excitation electrode side to another end, the other end extending to the second bonding surface, the second extraction electrode has a second length extracted from one end of the second excitation electrode side to another end, the other end extending to the second bonding surface, the first length is shorter than the second length, the first excitation electrode is thinner than the second excitation electrode, and a part of the first extraction electrode is thinner than the second extraction electrode.

6. The piezoelectric vibrating piece according to claim 1, wherein, the first extraction electrode is disposed on the first bonding surface of the framing portion, and a total area of the first extraction electrode and the second extraction electrode at the lid plate side of the connecting portion is smaller than a total area of the first extraction electrode and the second extraction electrode at the base plate side of the connecting portion.

7. The piezoelectric vibrating piece according to claim 1, wherein, the first extraction electrode is disposed on a side face of the first side of the excitation unit.

8. The piezoelectric vibrating piece according to claim 7, wherein, the first extraction electrode is disposed on a side face of the framing portion, the side face intersecting with both the bonding surfaces.

9. The piezoelectric vibrating piece according to claim 5, wherein, a width of a portion of the first extraction electrode where the first extraction electrode connects the first excitation electrode is larger than a width of a portion of the second extraction electrode where the second excitation electrode connects the second extraction electrode.

10. The piezoelectric vibrating piece according to claim 1, wherein, the connecting portion has a first thickness in the confronting direction of the planar surfaces, the excitation unit includes:

a first region, including at least a part of the first side, the first region with the first thickness being directly connected to the connecting portion in the confronting direction of the planar surfaces; and a second region, other than the first region where the first and the second excitation electrodes are disposed, and a thickness of the second region in the confronting direction of the planar surfaces is thinner than a thickness of the first region in the confronting direction of the planar surfaces.

11. The piezoelectric vibrating piece according to claim 1, wherein, the connecting portion has a first thickness in the confronting direction of the planar surfaces, and the excitation unit includes:

a first region, including at least a part of the first side, the first region with the first thickness being directly connected to the connecting portion in the confronting direction of the planar surfaces;

a third region, having a second thickness in the confronting direction of the planar surfaces, the first and the second excitation electrodes being disposed on the third region; and a fourth region, other than the first region and the third region, the fourth region having a third thickness in the confronting direction of the planar surfaces, the fourth region being disposed between the first region and the third region, wherein, the first thickness and the second thickness are thicker than the third thickness.

12. A piezoelectric device comprising:

the piezoelectric vibrating piece according to claim 1;

the lid plate; and the base plate, wherein, the piezoelectric vibrating piece is sandwiched between the lid plate and the base plate.

* * * * *